United States Patent
Paek et al.

(10) Patent No.: US 9,843,260 B1
(45) Date of Patent: Dec. 12, 2017

(54) SUPPLY MODULATOR INCLUDING SWITCHED-MODE POWER SUPPLIER AND TRANSMITTING DEVICE INCLUDING THE SAME

(71) Applicant: Samsung Electronics Co., Ltd., Suwon-si (KR)

(72) Inventors: Ji Seon Paek, Suwon-si (KR); Dongsu Kim, Suwon-si (KR); Younghwan Choo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/400,414

(22) Filed: Jan. 6, 2017

(30) Foreign Application Priority Data

Nov. 1, 2016 (KR) .......................... 10-2016-0144249

(51) Int. Cl.
*H04B 1/04* (2006.01)
*H02M 3/158* (2006.01)

(52) U.S. Cl.
CPC .................................. *H02M 3/158* (2013.01)

(58) Field of Classification Search
CPC .. H02M 3/158; H02M 3/1584; H02M 3/1588; H04B 1/02; H04B 1/04; H04B 1/14; H04B 1/16; H04B 10/50; H04B 2001/0408; H04B 1/0475; H03H 19/00; H03H 19/46

See application file for complete search history.

(56) References Cited

U.S. PATENT DOCUMENTS

| | | | |
|---|---|---|---|
| 6,348,780 | B1 | 2/2002 | Grant |
| 6,724,596 | B2 | 4/2004 | Wade |
| 6,984,969 | B1 * | 1/2006 | Liu ........................ H02M 3/158 323/280 |
| 8,093,882 | B2 * | 1/2012 | Terdan ............... H03K 19/0008 323/282 |
| 8,742,741 | B2 | 6/2014 | Zhao et al. |
| 8,988,056 | B2 | 3/2015 | Smith, Jr. et al. |
| 2005/0064830 | A1 | 3/2005 | Grigore |
| 2008/0067988 | A1 * | 3/2008 | Yabuzaki .............. H02M 3/158 323/271 |
| 2014/0084888 | A1 | 3/2014 | Kim et al. |
| 2014/0292292 | A1 | 10/2014 | Koski |
| 2016/0191294 | A1 * | 6/2016 | Hezar .................. H04B 14/062 375/295 |

FOREIGN PATENT DOCUMENTS

WO 2014/204408 12/2014

* cited by examiner

*Primary Examiner* — Gary L Laxton
(74) *Attorney, Agent, or Firm* — H.C. Park & Associates, PLC

(57) ABSTRACT

A supply modulator including a first switched-mode power supplier configured to transmit a modulated voltage to an output node in response to an envelope signal, the first switched mode power supplier including: a switching circuit configured to transmit a pulse signal in response to the amplitude of the envelope signal; and a low pass filter configured to generate the modulated voltage by filtering certain frequency band of the pulse signal, the low pass filter comprising a plurality of stages; and a second switched-mode power supplier configured to selectively transmit a compensation current to the output node in response to the current transmitted from the first switched-mode power supplier, wherein each of the plurality of stages of the low pass filter comprises at least one variable impedances.

20 Claims, 17 Drawing Sheets

SUPPLY MODULATOR INCLUDING SWITCHED-MODE POWER SUPPLIER AND TRANSMITTING DEVICE INCLUDING THE SAME

CROSS-REFERENCE TO RELATED APPLICATION

This application claims priority from and the benefit of Korean Patent Application No. 10-2016-0144249, filed on Nov. 1, 2016, which is hereby incorporated by reference for all purposes as if fully set forth herein.

BACKGROUND

Field

Exemplary embodiments relate to an electronic device, and, more particularly, to a supply modulator including a switched-mode power supplier and a transmitting device including the supply modulator.

Discussion

Battery power management is critical for certain electronic devices, such as mobile communication terminals. For such electronic devices, a high-efficiency radio frequency power amplifier may be provided to extend battery time.

As mobile communications technologies evolved from 2G to 3G and from 3G to 4G, high Peak-to-Average Power Ratio (PAPR) characteristic of an input signal has been achieved. However, the efficiency of a radio frequency power amplifier using a direct current (DC) source may decrease as the PAPR is increased. For example, such power amplifiers may have decreased power efficiency in a back-off power region. Therefore, there is an ongoing need for technologies for improving the power consumption efficiency of the radio frequency power amplifier having increased PAPR.

An Average Power Tracking (APT) method may be used to improve the decreased power efficiency in the back-off power region, where the APT method may track the average power of an input signal, control the supply voltage based on the tracking result, and amplify a radio signal by using the controlled supply voltage. However, the APT method does not track the envelope of the input signal in real time, and consequently, the radio frequency power amplifier that utilizes the APT method may still have a power loss.

An envelope tracking method may track the envelope of an input signal in real time, control the supply voltage based on the tracking result, and amplify a radio signal by using the controlled supply voltage. The envelop tracking method requires a supply modulator that modulates the supply voltage of a battery along the envelope of an input signal. Further, the supply modulator should have high power efficiency and a wide frequency bandwidth to cover envelope signals of various frequency bands.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a supply modulator configured to process the envelope of signals in various frequency bands and a transmitting device including the supply modulator.

Additional aspects will be set forth in the detailed description which follows, and, in part, will be apparent from the disclosure, or may be learned by practice of the inventive concept.

According to one or more exemplary embodiments, a supply modulator includes: a first switched-mode power supplier configured to transmit a modulated voltage to an output node in response to an envelope signal, the first switched-mode power supplier including: a switching circuit configured to transmit a pulse signal in response to the amplitude of the envelope signal; and a low pass filter configured to generate the modulated voltage by filtering certain frequency band of the pulse signal, the low pass filter including a plurality of stages; and a second switched-mode power supplier configured to selectively transmit a compensation current to the output node in response to the current transmitted from the first switched-mode power supplier, wherein each of the plurality of stages of the low pass filter includes at least one variable impedances.

According to one or more exemplary embodiments, a supply modulator includes: a first switched-mode power supplier configured to transmit a modulated voltage to an output node in response to an envelope signal, the first switched-mode power supplier including: a first sub switched-mode power supplier; and a second sub switched-mode power supplier; and a second switched-mode power supplier configured to selectively transmit a compensation current to the output node in response to the current transmitted from the first switched-mode power supplier, wherein each of the first sub switched-mode power supplier and the second sub switched-mode power supplier include: a switching circuit configured to transmit a pulse signal in response to the amplitude of the envelope signal; and a low pass filter configured to generate the modulated voltage by filtering certain frequency band of the pulse signal, the low pass filter including a plurality of stages, wherein each of the plurality of stages of the low pass filter includes at least one variable impedances.

According to one or more exemplary embodiments, a hybrid supply modulator includes: a first switched-mode power supplier and a second switched-mode power supplier, each configured to receive envelope signal and transmit respectively generated modulated voltages to an output node, wherein the first switched-mode power supplier includes: a pulse input node configured to receive a pulse signal based on the amplitude of the envelope signal; and a plurality of stages sequentially connected between the pulse input node and the output node, the plurality of stages configured to generate the modulated voltage by filtering certain frequency band of the pulse signal, wherein each of the plurality of stages of the low pass filter includes at least one variable impedances.

According to one or more exemplary embodiments, a transmitting device includes: a modem configured to generate a baseband signal and an envelope data corresponding the baseband signal; a supply modulator including a first switched-mode power supplier and a second switched-mode power supplier configured to transmit generated modulated voltages to an output node based on the envelope data; and a power amplifier configured to amplify a carrier wave signal by using the modulated voltages, the carrier wave signal being associated with the baseband signal, wherein the first switched-mode power supplier includes: a pulse input node to receive a pulse signal generated based on the envelope data; and a plurality of stages sequentially connected between the pulse input node and the output node, the plurality of stages configured to generate a modulated voltage by filtering certain frequency band of the pulse signal, and wherein each of the plurality of stages includes at least one variable impedances.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
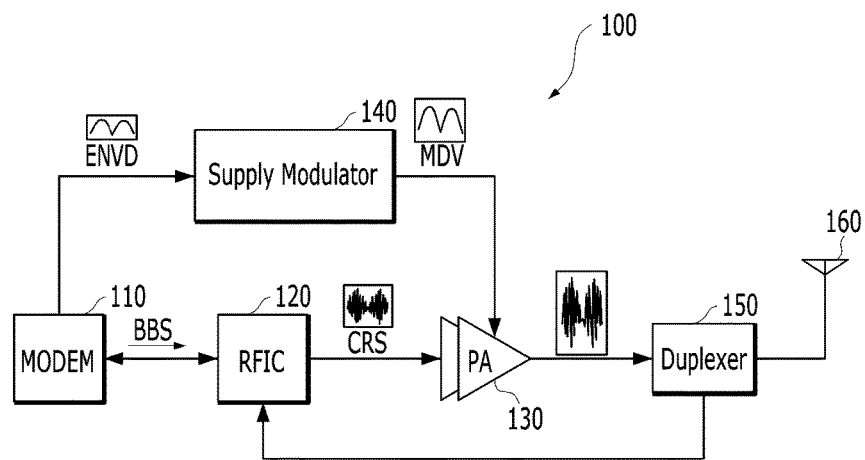
FIG. 1 is a block diagram illustrating a transmitting device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, blocks, components, modules, elements, and/or aspects of the various illustrations may be otherwise combined, separated, interchanged, and/or rearranged without departing from the disclosed exemplary embodiments. Further, in the accompanying figures, the size and relative sizes of blocks, components, modules, elements, etc., may be exaggerated for clarity and descriptive purposes. Also, like reference numerals may denote like or similar elements.

When an element is referred to as being "connected to" or "coupled to" another element, it may be directly connected to or coupled to the other element or intervening elements or may be present. When, however, an element or layer is referred to as being "directly connected to" or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram illustrating a transmitting device according to an exemplary embodiment.

Referring to FIG. 1, the transmitting device 100 includes a modem 110, a radio frequency integrated circuit (RFIC) 120, a power amplifier 130, a supply modulator 140, and a duplexer 150.

The modem 110 generates a baseband signal BBS including data for transmission. The modem 110 provides the supply modulator 140 with envelope data ENVD corresponding to the baseband signal BBS. For example, the modem 110 generates the envelope data ENVD through an amplitude modulation of the baseband signal BBS, and provides the supply modulator 140 with the envelope data ENVD.

The radio frequency integrated circuit (RFIC) 120 modulates the baseband signal BBS and generates carrier wave signal CRS of a high frequency band, and transmit the generated carrier wave signal CRS to the power amplifier 130. The radio frequency integrated circuit (RFIC) 120 converts the radio signal received through the duplexer 150 to be within a range of the baseband signal BBS, and provides the modem 110 with the converted radio signal.

The power amplifier 130 amplifies the carrier wave signal CRS to a target power level using a modulated voltage MDV received from the supply modulator 140, and transmits the amplified carrier wave signal CRS to the duplexer 150. The amplification gain may be controlled in accordance with the level of the modulated voltage MDV.

The supply modulator 140 modulates a DC supply voltage, e.g., a voltage from a battery, according to the envelope represented by the envelope data ENVD, and provide the power amplifier 130 with the modulated DC voltage MDV. If the modulated DC voltage MDV effectively tracks the envelope corresponding to the envelope data ENVD, the power consumed by the power amplifier 130 may be reduced.

The duplexer 150 is connected to an antenna 160. The duplexer 150 transmits, through the antenna 160, the amplified carrier wave signal received from the power amplifier 130. The duplexer 150 may include a transmitter and a receiver. The duplexer 150 may protect the receiver from an adverse effect that may be caused by the amplified carrier wave signal transmitted through the antenna 160. The duplexer 150 may also provide the receiver with an echo signal (echo talker) when a radio signal is received through the antenna 160.

Figure 2:
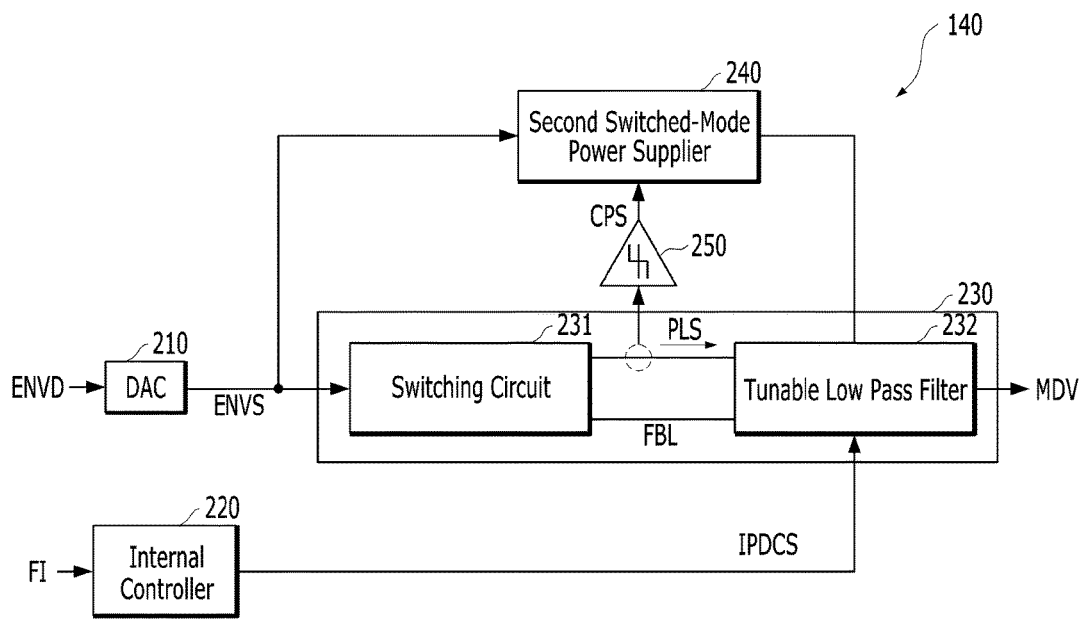
FIG. 2 is a block diagram of an exemplary embodiment of a supply modulator of FIG. 1.

FIG. 2 is a block diagram of an exemplary embodiment of the supply modulator 140 of FIG. 1.

Referring to FIG. 2, the supply modulator 140 includes a Digital-to-Analog (D/A) converter 210, an internal controller 220, a first switched-mode power supplier 230, a second switched-mode power supplier 240, and a comparator 250.

The D/A converter 210 receives the envelope data ENVD from the modem 110 (see FIG. 1), and converts the envelope data ENVD, which is a digital signal, to an envelope signal ENVS, which is an analog signal. The D/A converter 210 provides the first and second switched-mode power suppliers 230 and 240 with the generated envelope signal ENVS.

According to an exemplary embodiment, an analog interface may be provided between the modem 110 and the supply modulator 140. In this case, the modem 110 may provide the envelope signal ENVS (an analog signal) through the analog interface, and the D/A converter 210 may be omitted.

The internal controller 220 may receive frequency information FI from the modem 110, and transmits impedance control signal IPDCS based on the received frequency information FI. The internal controller 220 may control the impedance of a tunable low pass filter 232 by controlling the impedance control signal IPDCS.

The internal controller 220 may apply various protocols to communicate with the modem 110. For example, the internal controller 220 may adopt Mobile Industry Processor Interface (MIPI) protocol.

The frequency information FI may include information associated with a frequency band including the baseband signal BBS corresponding to the envelope signal ENVS (see FIG. 1). Accordingly the value of the frequency information FI may be changed depending on the frequency band of the baseband signal BBS.

According to an exemplary embodiment, the frequency information FI may include information associated with the frequency bandwidth of the baseband signal BBS. The value of the frequency information FI may be changed depending on the frequency bandwidth of the baseband signal BBS.

For example, the frequency information (FI) may include information associated with a guard bandwidth between a frequency band of a transmission channel and a frequency band of a reception channel in a Frequency Division Duplex (FDD) scheme. For example, mobile network operators may define different guard bandwidth of the FDD scheme. According to the width of the guard bandwidth, the interference between the transmit channel and the reception channel may be determined. When the guard bandwidth is narrowed, the interference between the transmit channel and the reception channel may be increased. When the guard bandwidth is widened, the interference between the transmit channel and the reception channel may be decreased. The value of the frequency information (FI) may be changed depending on the size of the guard bandwidth.

The first switched-mode power supplier 230 receives the envelope signal ENVS. The first switched-mode power supplier 230 include a switching circuit 231 and a tunable low pass filter 232.

The switching circuit 231 transmits a pulse signal PLS based on the amplitude of the envelope signal ENVS. The switching circuit 231 also receives a feedback voltage from the tunable low pass filter 232 based on the modulated voltage MDV through a feedback line FBL, and generated a switching signal by comparing the voltage of the envelope signal ENVS and the feedback voltage. Further, the switching circuit 231 may generate the pulse signal PLS by selectively transmitting a source voltage and a ground voltage according to the switching signal. Accordingly, the pulse signal PLS has a specific frequency.

In the first switched-mode power supplier 230, the frequency of the pulse signal PLS is set to be higher than the frequency of the envelope signal ENVS. Accordingly, the frequency of the pulse signal PLS is filtered by the tunable low pass filter 232.

The tunable low pass filter 232 filters certain frequency bands of the pulse signal PLS and transmits the modulated voltage MDV. According to the exemplary embodiments, the tunable low pass filter 232 includes a plurality of stages, and each of the plurality of stages includes at least one variable impedance element. This feature will be described in more detail with reference to FIG. 3.

The second switched-mode power supplier 240 receives the envelope signal ENVS. The second switched-mode power supplier 240 provide the tunable low pass filter 232 with a compensation current based on the envelope signal ENVS and a comparison signal CPS. According to the exemplary embodiments, the second switched-mode power supplier 240 generates a switching signal by comparing the voltage of the envelope signal ENVS and the voltage of the comparison signal CPS, and provide a current by selectively transmitting the source voltage and the ground voltage according to the switching signal.

The comparator 250 generates the comparison signal CPS according to the current level generated by the first switched-mode power supplier 230. As illustrated in FIG. 2, the comparator 250 may monitor the current flowing through the line which the pulse signal PLS is transmitted. The current that flows through the line may vary in response to the equivalent impedance connected to the line. The comparator 250 may transmit the comparison signal CPS, which varies according to the monitored current level.

For example, the first and second switched-mode power suppliers 230 and 240 may be buck converters.

Figure 3:
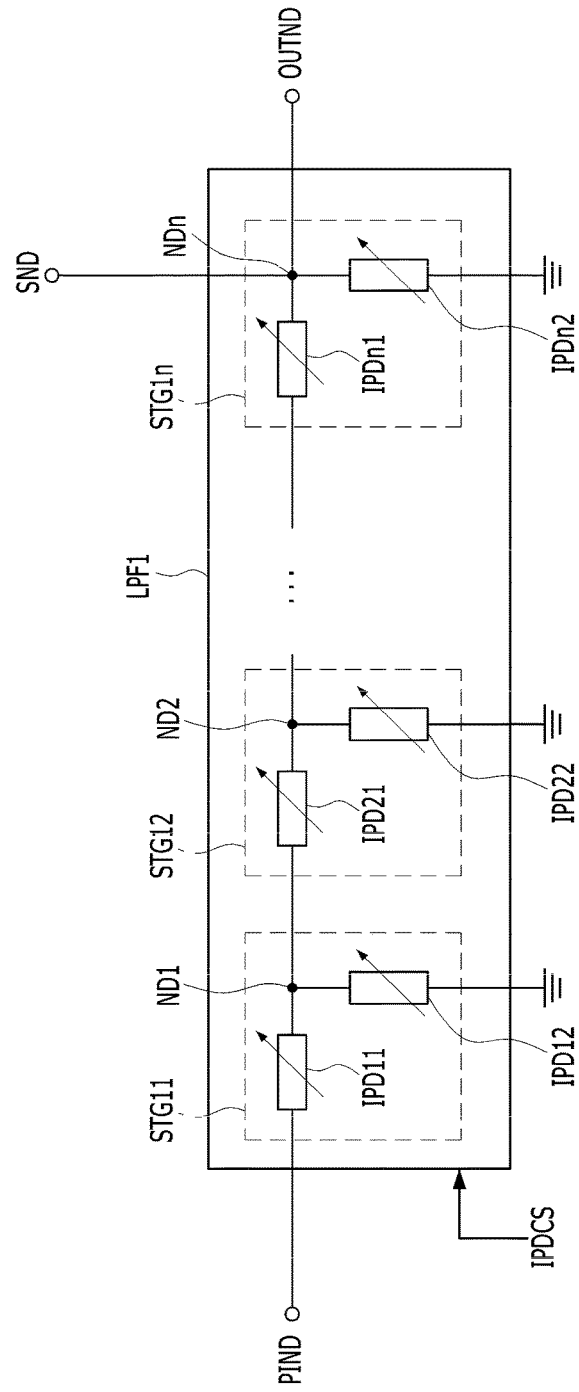
FIGS. 3 and 4 are diagrams illustrating exemplary embodiments of a tunable low pass filter of FIG. 2.

FIG. 3 is a diagram illustrating an exemplary embodiment of the tunable low pass filter 232 of FIG. 2.

Referring to FIG. 3, the tunable low pass filter LPF1 includes the first to n-th stages STG11, STG12, . . . , STG1$n$, which are sequentially connected between a pulse input node PIND and an output node OUTND. The pulse input node PIND is configured to receive the pulse signal PLS (refer to FIG. 2). The output node OUTND is configured to transmit the modulate voltage MDV (refer to FIG. 2).

Each of the first to n-th stages STG11, STG12, . . . , and STG1$n$ include a first impedance element, a second impedance element, and a node. The first impedance element of each of the first to n-th stages STG11, STG12, . . . , STG1$n$ is connected between the node of the previous stage and the node of the current stage, and the second impedance element each of the first to n-th stages STG11, STG12, . . . , STG1$n$ is connected between the node of the current stage and the ground. At least one of the first impedance element and the second impedance element may have variable impedance that may be controlled according to an impedance control signal IPDCS.

The first stage STG11 includes a first impedance element IPD11 connected between the pulse input node PIND and the first internal node ND1, and a second impedance element IPD12 connected between the first internal node ND1 and the ground. The second stage STG12 includes a first impedance element IPD21 connected between the first internal node ND1 and a second internal node ND2, and a second impedance element IPD22 connected between the second internal node ND2 and the ground. Similarly, the n-th stage STG1$n$ (n is an integer greater than one) includes a first impedance element IPDn1 connected between (n−1)-th internal node NDn-1 and the n-th internal node NDn and a second impedance element IPDn2 connected between the n-th internal node NDn and the ground. The n-th internal node NDn is connected to the output node OUTND.

According to the exemplary embodiments, the plurality of stages STG11, STG12, . . . , STG1$n$ is a tunable low pass filter of fourth-order or higher order.

At least one of the impedance elements may have a variable impedance, which may be controlled in response to the impedance control signal IPDCS. As shown in FIG. 3, the impedance elements IPD11, IPD12, IPD21, IPD22, . . . , IPDn1, and IPDn2 may have variable impedances. According to exemplary embodiments, the first impedance elements IPD11, IPD21, . . . , and IPDn1 may have fixed impedances, and the second impedance elements IPD12, IPD22, . . . , and IPDn2 may have variable impedances. The first impedance elements IPD11, IPD21, . . . , and IPDn1 may be referred to as inter-stage impedance elements, and the second impedance elements IPD12, IPD22, . . . , and IPDn2 may be referred to as grounded impedance elements.

The tunable low pass filter LPF1 may also include a sum node SND may be provided to receive an output current of the second switched-mode power supplier 240. For example, the sum node SND may be connected to the output node OUTND as shown in FIG. 3.

The internal controller 220 (see FIG. 2) may control impedances of the variable impedance element among the impedance elements IPD11, IPD12, IPD21, IPD22, . . . , IPDn1, and IPDn2 by transmitting the impedance control signal IPDCS generated by the internal controller 220 in response to the frequency information FI (see FIG. 2).

According to the exemplary embodiments, the frequency information FI represents the frequency band(s) including the baseband signal BBS. The internal controller 220 may control the first and second impedance elements of the tunable low pass filter such that the passband of the tunable low pass filter LPF1 is increased as the frequency band of the baseband signal BBS is increased.

According to the exemplary embodiments, the frequency information FI represents the frequency bandwidth including the baseband signal BBS. The internal controller 220 may control the first and second impedance elements of the tunable low pass filter such that the passband of the tunable low pass filter LPF1 is widened as the frequency bandwidth of the baseband signal BBS is widened.

According to the exemplary embodiments, the frequency information FI may include information associated with a guard bandwidth between a frequency band of a transmission channel and a frequency band of a reception channel of the FDD scheme. The internal controller 220 may control the first and second impedance elements of the tunable low pass filter such that the passband of the tunable low pass filter LPF1 is narrowed as the bandwidth of the guard band is narrowed.

Figure 4:
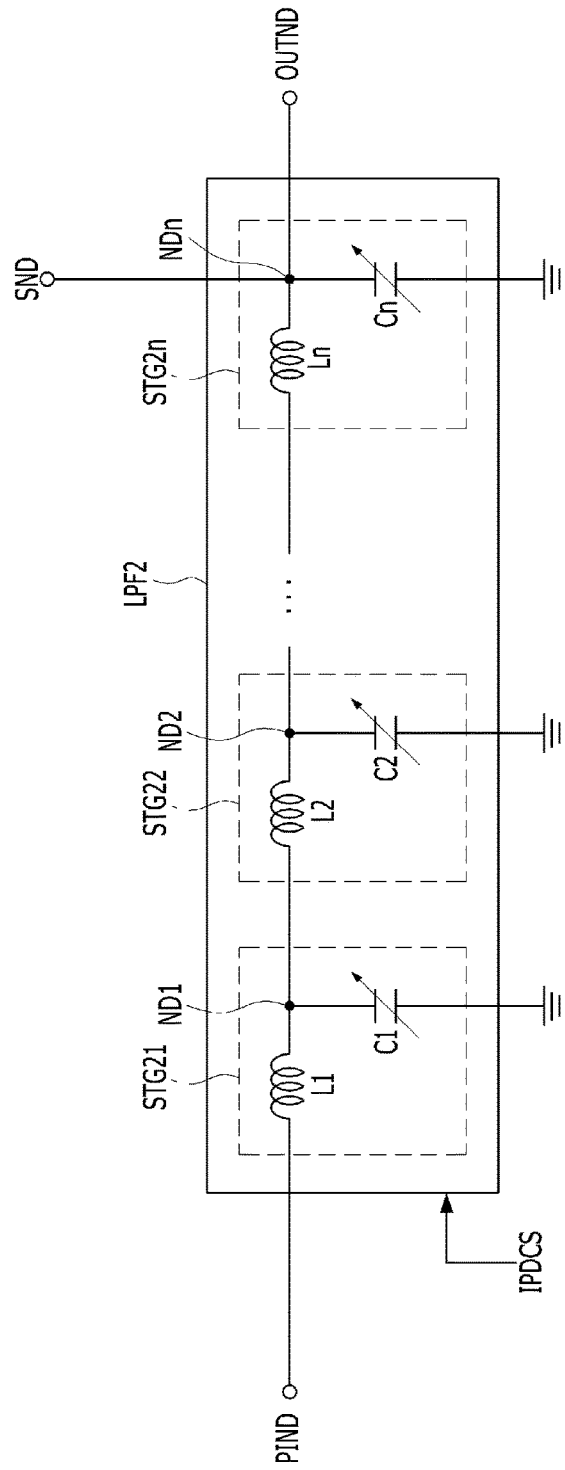
Figure 5:
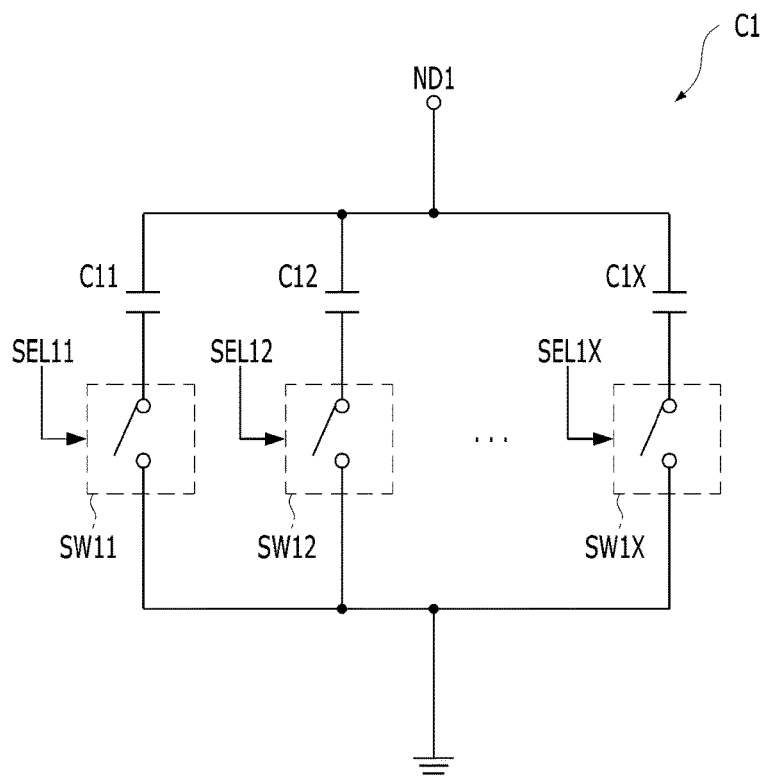
FIG. 5 is a circuit diagram illustrating an exemplary embodiment of the first capacitor through the n-th capacitor of FIG. 4.
Figure 6:
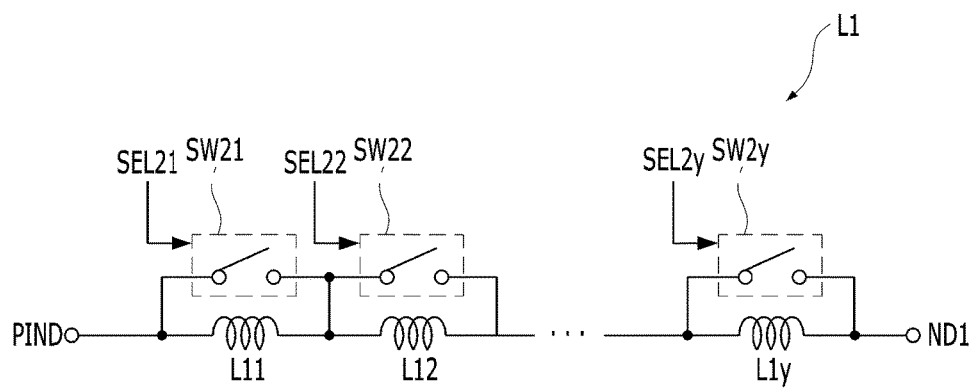
FIG. 6 is a circuit diagram illustrating an exemplary embodiment of the first inductor through the n-th inductor of FIG. 4.

FIG. 4 is a diagram illustrating another exemplary embodiment of the tunable low pass filter of FIG. 2. FIG. 5 is a circuit diagram illustrating an exemplary embodiment of the first capacitor through the n-th capacitor of FIG. 4. FIG. 6 is a circuit diagram illustrating an exemplary embodiment of the first inductor through the n-th inductor of FIG. 4.

Referring to FIG. 4, the tunable low pass filter LPF2 includes the first to n-th stages STG21, STG22, . . . , and STG2$n$, which are sequentially connected between a pulse input node PIND and an output node OUTND. The pulse input node PIND is configured to receive the pulse signal PLS (refer to FIG. 2). The output node OUTND is configured to transmit the modulate voltage MDV (refer to FIG. 2). Each of the first to n-th stages STG21, STG22, . . . , and STG2$n$ include an inductor, a capacitor, and a node. The inductor of each of the first to n-th stages STG21, STG22, . . . , STG2$n$ is connected between the node of the previous stage and the node of the current stage, and a capacitor of each of the first to n-th stages STG21, STG22, . . . , STG2$n$ is connected between the node of the current stage and the ground.

The first stage STG21 includes a first inductor L1 connected between the pulse input node PIND and the first internal node ND1, and a first capacitor C1 connected between the first internal node ND1 and the ground. The second stage STG22 includes a second inductor L2 connected between the first internal node ND1 and a second internal node ND2, and a second capacitor C2 connected between the second internal node ND2 and the ground. Similarly, the n-th stage STG2$n$ (n is an integer greater than one) includes an n-th inductor Ln connected between (n−1)-th internal node NDn−1 and the n-th internal node NDn, and an n-th capacitor Cn connected between the n-th internal node NDn and the ground. The n-th internal node NDn is connected to the output node OUTND.

Referring to FIG. 4, according to the exemplary embodiments, the first to n-th inductors L1, L2, ..., and Ln may have fixed inductances, and the first to n-th capacitors C1, C2, ..., and Cn may have tunable (or variable) capacitances, which vary according to an impedance control signal IPDCS, e.g., a capacitance control signal. According to the exemplary embodiments, the first to n-th inductors and the first to n-th capacitors may respectively have variable inductances and variable capacitances, which vary according to an impedance control signal IPDCS.

Various capacitors may be adopted in configuring the tunable low pass filter. For example, referring to FIG. 5, the first capacitor C1 may include a plurality of capacitors C11, C12, ..., and C1x connected to the first internal node ND1 in parallel and a plurality of switches SW11, SW12, ..., and SW1x, respectively connected between the plurality of capacitors C11, C12, ..., and C1x and the ground. According to selection signals SEL11, SEL12, ..., and SEL1x, the plurality of switches SW11, SW12, ..., and SW1x are respectively turned on and the number of active capacitors connected in parallel between the first internal node ND1 and the ground may be controlled. Accordingly, the capacitance of the first capacitor C1 may be controlled.

Various variable impedance elements may be adopted in configuring the tunable low pass filter. For example, as shown in FIG. 6, the first inductor L1 includes a plurality of inductors L11, L12, ..., and L1y sequentially connected between the pulse input node PIND and the first internal node ND1 in series and a plurality of switches SW21, SW22, ..., SW2y, respectively connected to the plurality of inductors L11, L12, ..., and L1y in parallel. According to selection signals SEL21, SEL22, ..., and SEL2y, the plurality of switches SW21, SW22, ..., and SW2y are turned on, and the number of active inductors connected in series between the pulse input node PIND and the first internal node ND1 may be controlled. Accordingly, the inductance of the first inductor L1 may be controlled.

Referring to FIG. 4, the inductances of the first to n-th inductors L1, L2, ..., and Ln and the capacitances of the first to n-th capacitors C1, C2, ..., and Cn may be controlled according to the impedance control signal IPDCS.

According to the exemplary embodiments, the frequency information FI may represent the frequency band of a baseband signal BBS, and the impedance control signal IPDCS may reduce at least one of the first to n-th capacitances C1, C2, ..., and Cn in response to the increase of the frequency band of the baseband signal BBS. Further, the impedance control signal IPDCS may reduce at least one of the first to n-th inductances L1, L2, ..., and Ln in response to the increase of the frequency band of the baseband signal BBS. Accordingly, the passband of the tunable low pass filter LPF2 may be increased.

According to the exemplary embodiments, the frequency information FI may represent the frequency bandwidth of a baseband signal BBS, and the impedance control signal IPDCS may reduce at least one of the first to n-th capacitances C1, C2, ..., and Cn in response to the widening of the frequency bandwidth of the baseband signal BBS. Further, the impedance control signal IPDCS may reduce at least one of the first to n-th inductances L1, L2, ..., and Ln in response to the widening of the frequency bandwidth of the baseband signal BBS.

According to the exemplary embodiments, the frequency information FI may include information associated with the guard bandwidth according to an FDD scheme, the internal controller 220 may increase at least one of the first to n-th capacitances C1, C2, ..., and Cn in response to narrowing of the guard bandwidth. Further, the internal controller 220 may increase at least one of the first to n-th inductances L1, L2, ..., and Ln in response to narrowing of the guard bandwidth. Accordingly, the passband of the tunable low pass filter LPF2 may be narrowed.

It should be understood that the technical features and aspects of the inventive concept of the exemplary embodiments are not limited thereto. Based on the number of inductors and capacitors in each of the stages STG21, STG22, ..., STG2n and the connection structures thereof, the method of controlling the capacitances and the inductances may be changed.

According to the exemplary embodiments, the stages STG21, STG22, ..., STG2n may be disposed outside of an integrated circuit (IC), in which other elements of the supply modulator 140 are disposed. According to the exemplary embodiments, if the tunable capacitors and the tunable inductors are configured as shown in FIG. 5 and FIG. 6, the plurality of capacitors C11, C12, ..., and C1x and the plurality of inductors L11, L12, ..., and L1y may be disposed outside of the IC in which other elements of the supply modulator 140, and switches SW11, SW12, ..., and SW1x and switches SW21, SW22, ..., and SW2y may be disposed in the IC.

Figure 7:
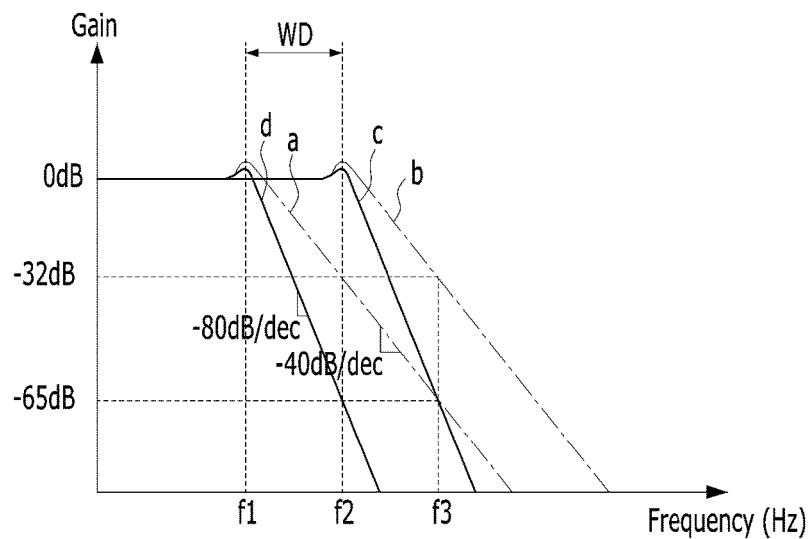
FIG. 7 is a graph illustrating the gain of the tunable low pass filter of FIG. 2.

FIG. 7 is a graph illustrating the gain of the tunable low pass filter 232 of FIG. 2. Referring to FIG. 7, the x-axis denotes a frequency of input signal and the y-axis denotes a gain of the tunable low pass filter 232.

Referring to FIG. 7, the gain of the tunable low pass filter 232 (see FIG. 2) is represented by a solid line. The slope of the gain of the tunable low pass filter 232 is decided by the number of stages included in the tunable low pass filter 232. For example, the gain of the tunable low pass filter 232 may have a slope of −80 dB/decade (dB/dec). The bandwidth of the passband of the tunable low pass filter 232, e.g., −3 dB bandwidth, may be controlled by tuning at least one impedance element included in each stage. For example, the bandwidth of the passband of the tunable low pass filter 232 may be controlled such that the passband is formed below a first frequency f1 or below a second frequency f2. Referring to FIG. 7, the frequency of the pulse signal PLS (see FIG. 2) may be a third frequency f3 and the pulse signal PLS may have −65 dB of attenuation, according to an exemplary embodiment. For example, the third frequency of the pulse signal PLS may cause a noise in the modulated voltage MDV, and the noise in the modulated voltage MDV may cause a noise in the amplified carrier wave signal generated by the power amplifier 130. The duplexer 150 (refer to FIG. 1) may have a standard on a maximum noise level of the amplified carrier wave signal received from the power amplifier 130. Accordingly, the noise in the modulated voltage MDV should be reduced so that the amplified carrier wave signal may be controlled under the maximum noise level required by the duplexer 150. Therefore, the pulse signal PLS need to be damped at a gain (for example, −65 dB).

According to an exemplary embodiment, the low pass filter may be a second-order filter having a gain slope of −40 dB/dec. The gain of the low pass filter having the gain slope of −40 dB/dec is shown in the dotted lies. In order for the pulse signal PLS with third frequency f3 to be damped at the gain of −65 dB, the low pass filter need to have a passband lower than the first frequency f1. (FIG. 7, graph a). If the passband of the low pass filter includes a frequency greater than the first frequency f1, the pulse signal PLS having the third frequency f3 may not be damped at the gain of −65 dB. For example, if the passband of the low pass filter includes the second frequency f2 (FIG. 7, graph b), the pulse signal PLS having the third frequency f3 is damped at the gain of −32 dB, and in turn, the noise in the modulated voltage is not sufficiently reduced.

According to the exemplary embodiments, the low pass filter having a gain slope of −80 dB/dec may damp the pulse signal PLS having the third frequency f3 at the gain of −65 dB while including the second frequency f2 in the passband of the low pass filter. Accordingly, the tunable low pass filter 232 including the plurality of stages may have an increased passband.

According to the exemplary embodiments, each of the plurality of stages of the tunable low pass filter 232 may include at least one variable impedance element. By controlling the variable impedance element included in each of the plurality of stages of the tunable low pass filter 232, the passband of the tunable low pass filter 232 may be controlled.

According to the exemplary embodiments, the variable impedance element included in each of the plurality of stages of the tunable low pass filter 232 may be controlled so that the tunable low pass filter 232 may have a passband lower than f1. (FIG. 7, graph d). In this case, the pulse signal PLS having the third frequency f3 may be more damped more strongly, and the noise in the modulated voltage MDV may be further reduced. Accordingly, the reliability of the first switched-mode power supplier 230 may be improved. For example, when the guard bandwidth of the FDD scheme is narrowed, the tunable low pass filter 232 may be controlled to have narrowed passband, so that the noise of the modulated voltage MDV may be effectively reduced. Furthermore, the tunable low pass filter 232 according to the exemplary embodiments may be controlled to have narrowed passband to respond to any necessity that the noise of the modulated voltage MDV be reduced.

According to the exemplary embodiments, the variable impedance element included in each of the plurality of stages of the tunable low pass filter 232 may be controlled so that the tunable low pass filter 232 may have a passband lower than f2. In this case, the frequency bandwidth of the envelope signal ENVS supported by the first switched-mode power supplier 230 may be increased by a frequency range WD. For example, when the baseband signal BBS has higher frequency band or widened frequency bandwidth, the tunable low pass filter 232 may be controlled to have increased passband, so that the baseband signal BBS having higher frequency band or widened frequency bandwidth may be supported.

Figure 8:
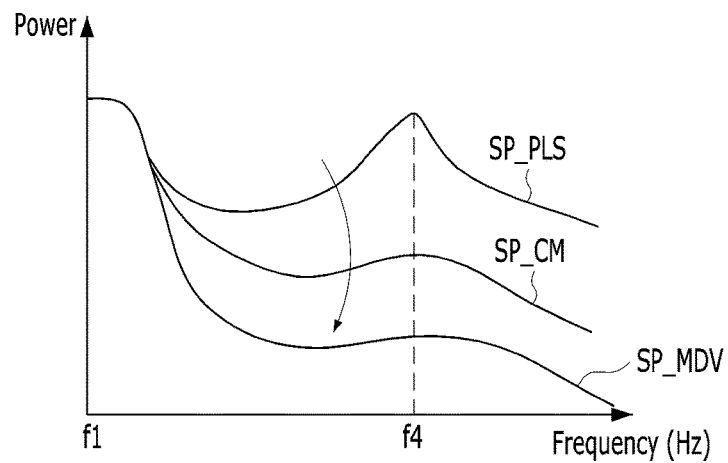
FIG. 8 is a graph illustrating a pulse signal and the power spectrum of a modulated voltage generated by the supply modulator of FIG. 1.

FIG. 8 is a graph illustrating a pulse signal and the power spectrum of a modulated voltage generated by the supply modulator of FIG. 1. Referring to FIG. 8, the x-axis denotes a frequency of input signal and the y-axis denotes a frequency power. According to the exemplary embodiment, the frequency band of the envelope signal ENVS is lower than the first frequency f1, and the frequency of the pulse signal PLS is a fourth frequency f4, which is less than the third frequency f3 of FIG. 7.

Referring to FIG. 8, the power spectrum of a pulse signal SP_PLS shows high frequency power at the first frequency f1 of the envelope signal ENVS, and the fourth frequency f4 of the pulse signal PLS.

In a comparable embodiment including a low pass filter having a gain slope of −40 dB/dec, since the frequency of the pulse signal PLS is f4 which is less than the third frequency f3, the pulse signal PLS may not be damped at a sufficient gain, which is, for example, −65 dB. Since the pulse signal PLS cannot be sufficiently damped at the fourth frequency f4, the power spectrum of the comparable modulated voltage SP_CM may show frequency power at the fourth frequency f4 greater than a certain threshold value.

According to the exemplary embodiment, the tunable low pass filter 232 includes the plurality of stages including variable impedance elements. The tunable low pass filter 232 may sufficiently damp the pulse signal PLS at the fourth frequency f4. Therefore, the power spectrum of the modulated voltage SP_MDV may show a frequency power at the fourth frequency f4 less than the certain threshold value.

Figure 9:
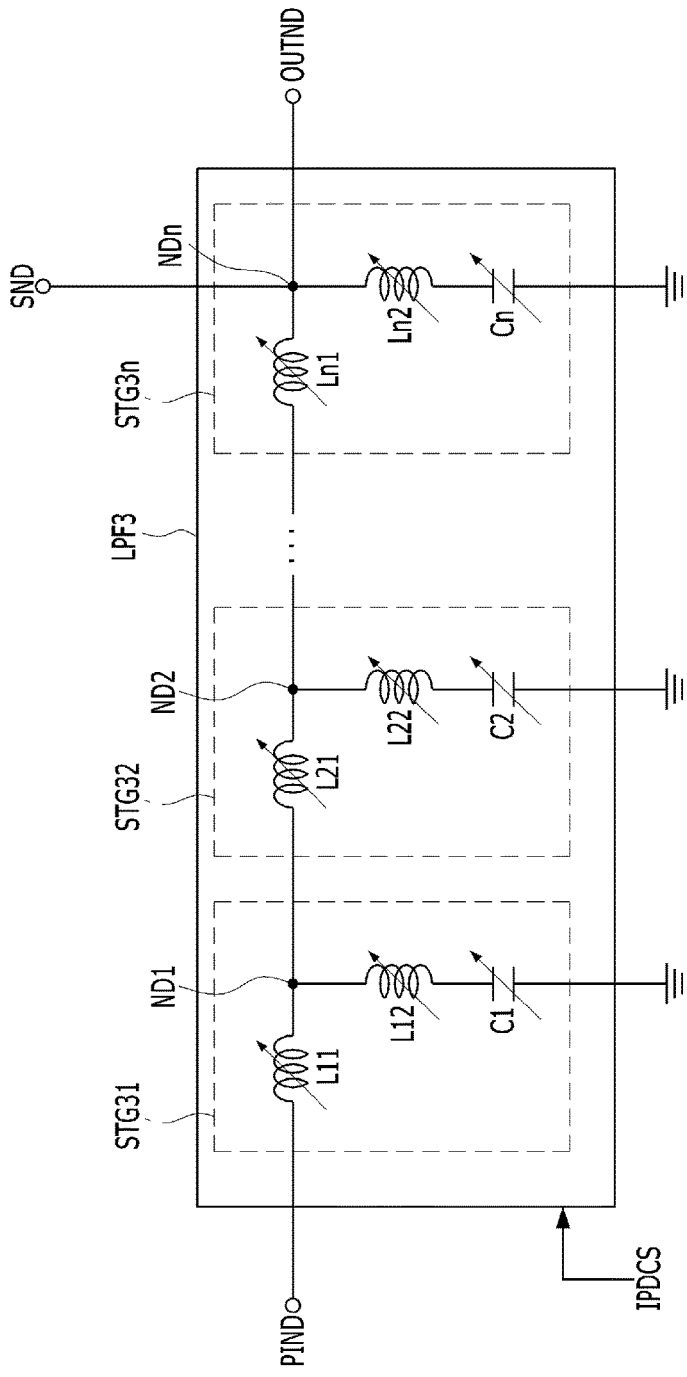
FIG. 9 is a block diagram illustrating an exemplary embodiment of the tunable low pass filter of FIG. 2.

FIG. 9 is a block diagram illustrating an exemplary embodiment of the tunable low pass filter of FIG. 2.

The first to n-th stages STG31, STG32, . . . , and STG3n of the tunable low pass filter may include various types of variable impedance elements. Referring to FIG. 9, each of the first to n-th stages STG31, STG32, . . . , and STG3n include an inductor, a capacitor, and a node. The inductor of each of the first to n-th stages STG31, STG32, . . . , and STG3n is connected between the node of the previous stage and the node of the current stage, and the inductor and the capacitor of each of the first to n-th stages STG21, STG22, . . . , STG2n is connected between the node of the current stage and the ground.

The first stage STG31 includes an inductor L11 connected between the pulse input node PIND and the first internal node ND1, and an inductor L12 and a first capacitor C1 connected between the first internal node ND1 and the ground. The second stage STG32 includes an inductor L21 connected between the first internal node ND1 and a second internal node ND2, and an inductor L22 and a capacitor C2 connected between the second internal node ND2 and the ground. Similarly, the n-th stage STG3n (n is an integer greater than one) includes an inductor Ln1 connected between (n−1)-th internal node NDn−1 and the n-th internal node NDn, and an inductor Ln2 and a capacitor Cn connected between the n-th internal node NDn and the ground. For example, the inductors L11, L12, L21, L22, . . . Ln1, and Ln2 and the capacitors C1, C2, . . . , and Cn may have variable impendence. For example, the inductors L11, L12, L21, L22, . . . Ln1, and Ln2 may have fixed inductances and the capacitors C1, C2, . . . , and Cn may have variable capacitances.

Figure 10:
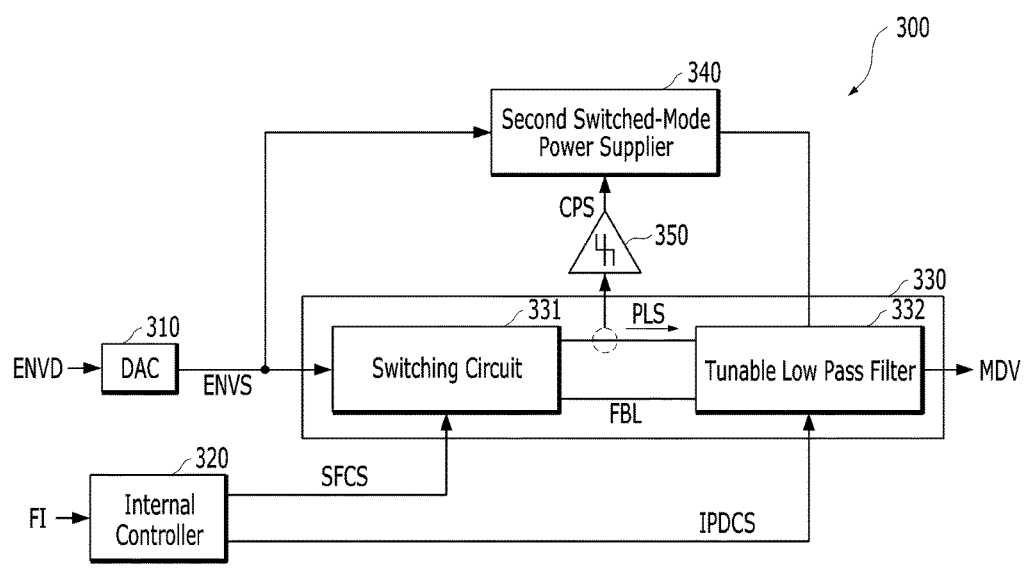
FIG. 10 is a block diagram illustrating an exemplary embodiment of a supply modulator of FIG. 1.

FIG. 10 is a block diagram illustrating an exemplary embodiment of a supply modulator of FIG. 1.

Referring to FIG. 10, the supply modulator 300 may include a Digital-to-Analog (D/A) converter 310, an internal controller 320, a first switched-mode power supplier 330, a second switched-mode power supplier 340 including a switching circuit 331 and a tunable low pass filter 332, and a comparator 350.

According to the exemplary embodiment, the internal controller 320 may control the switching circuit 331 in response to the received frequency information FI. Referring to FIG. 10, the internal controller may generate a switching frequency control signal SFCS in response to the received frequency information FI and transmit the switching frequency control signal SFCS to the switching circuit 331.

According to the exemplary embodiment, the frequency information FI may represent the frequency band of the baseband signal BBS, and the internal controller 320 may reduce the frequency of the pulse signal PLS as the frequency band of the baseband signal BBS is decreased.

According to the exemplary embodiment, the frequency information FI may represent the frequency bandwidth of the baseband signal BBS, and the internal controller 320 may narrow the frequency bandwidth of the pulse signal PLS as the frequency band of the baseband signal BBS is decreased.

According to the exemplary embodiment, the frequency information FI may include information associated with a guard bandwidth between a frequency band of a transmission channel and a frequency band of a reception channel of the FDD scheme, and the internal controller may reduce the frequency of the pulse signal PLS as the guard bandwidth is widened.

Figure 11:
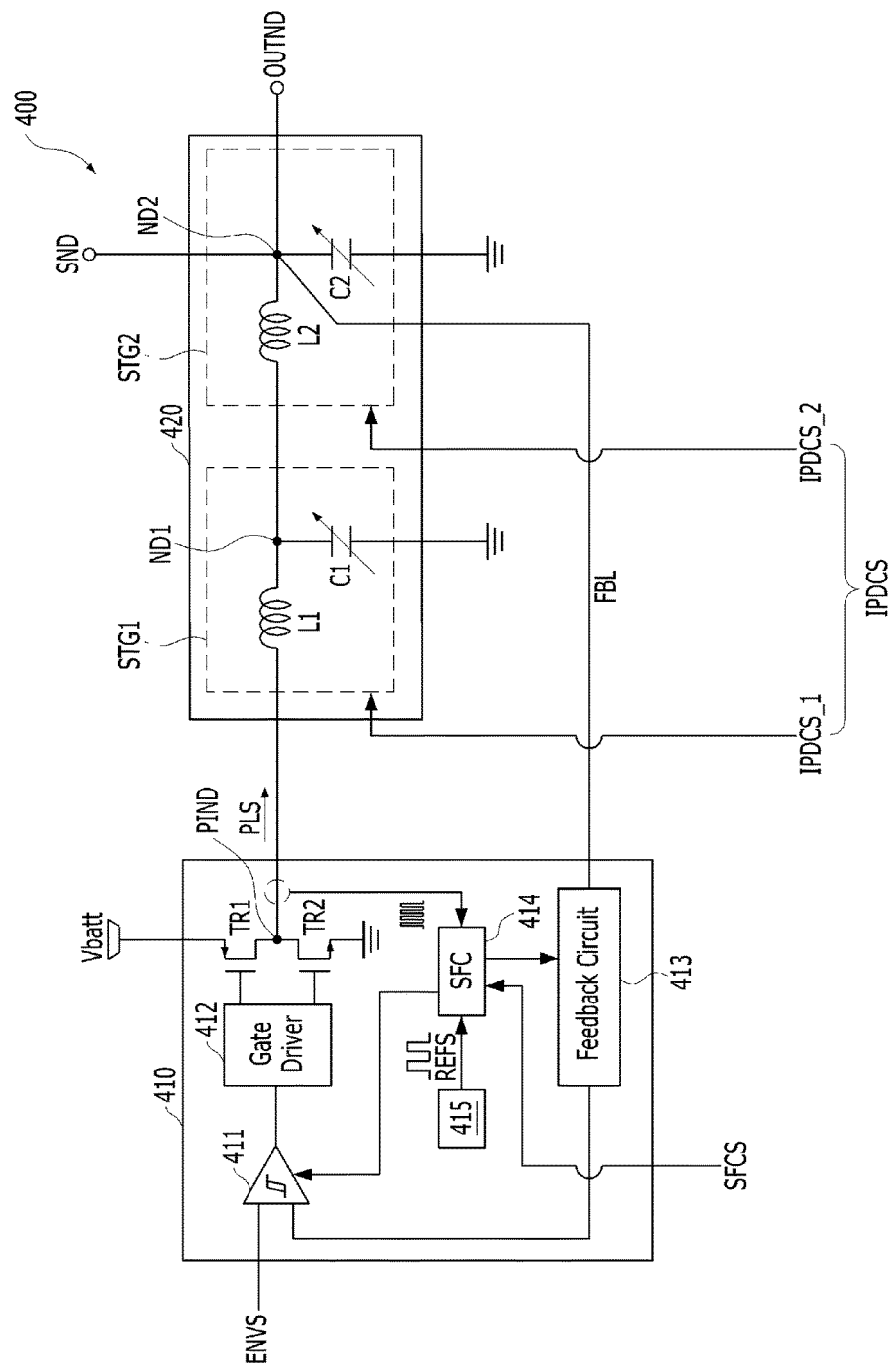
FIG. 11 is a block diagram illustrating an exemplary embodiment of a first switched-mode power supplier of FIG. 10.

FIG. 11 is a block diagram illustrating an exemplary embodiment of a first switched-mode power supplier of FIG. 10.

Referring to FIG. 11, the first switched-mode power supplier 400 may include a switching circuit 410 and a tunable low pass filter 420.

The switching circuit 410 includes a hysteresis comparator 411, a gate driver 412, switching transistors TR1 and TR2, a feedback circuit 413, a switching frequency controller (SFC) 414, and a oscillator 415.

The hysteresis comparator 411 may compare the voltage of the envelope signal ENVS and the feedback voltage received from the feedback circuit 413, and may transmit a switching signal in response to the result of the comparison to the gate driver 412. The hysteresis comparator 411 may transmit enable or disable the switching signal in response to the difference of the voltage of the envelope signal ENVS and the feedback voltage. The hysteresis comparator 411 may have a hysteresis window. Particularly, the hysteresis comparator 411 may enable the switching signal in response to the voltage of the envelope signal ENVS is greater than the feedback voltage by a first threshold voltage, and may disable the switching signal in response to the voltage of the envelope signal ENVS is less than the feedback voltage by a second threshold voltage.

The gate driver 412 may control the first and second switching transistors TR1 and TR2 in response to the switching signal received from the hysteresis comparator 411. For example, the gate driver 412 may turn on the first switching transistors TR1 and turn off the second switching transistors TR2 when the switching signal is enabled. For example, the gate driver 412 may turn off the first switching transistors TR1 and turn on the second switching transistors TR2 when the switching signal is disabled. Accordingly, the pulse signal PLS may be transmitted through the pulse input node PIND.

According to exemplary embodiments, the first switching transistor TR1 may be a p-channel metal-oxide-semiconductor (PMOS) transistor and the second switching transistor TR2 may be a n-channel metal-oxide-semiconductor (NMOS) transistor.

The feedback circuit 413 is connected to the output node OUTND. The feedback circuit 413 may generate the feedback voltage in response to the modulated voltage MDV applied on the output node OUTND, and transmit the generated feedback voltage to the hysteresis comparator 411. According to the exemplary embodiments, the feedback circuit 413 may include an impedance element such as a resistor, a capacitor, and an inductor. According to the exemplary embodiments, the feedback line FBL connected to the output node OUTND may also be connected to internal nodes of each stages and the pulse input node PIND.

The switching frequency controller 414 may receive the switching frequency control signal SFCS. The switching frequency control signal SFCS is received from the internal controller 320 (refer to FIG. 10).

The switching frequency controller 414 may control the frequency of the pulse signal PLS by controlling at least one of the hysteresis comparator 411 and the feedback circuit 413. For example, the switching frequency controller 414 may control the hysteresis window of the hysteresis comparator 411 in response to the switching frequency control signal SFCS. For example, the switching frequency controller 414 may control the impedance of the feedback circuit 413 to control the gain slope of the feedback voltage. More particular, the frequency of the pulse signal PLS. The frequency of the pulse signal PLS may be changed in response to the size of a hysteresis window and the feedback voltage and the feedback voltage.

According to the exemplary embodiment, the switching frequency controller 414 may receive a reference signal REFS from the oscillator 415. The switching frequency controller 414 may compare a magnification between the frequency of the pulse signal PLS and the frequency of the reference signal REFS with the switching frequency control signal SFCS, and may control at least one of the hysteresis comparator 411 and the feedback circuit 413 in response to the result of the comparison.

The tunable low pass filter 420 includes a plurality of stages STG1 and STG2 sequentially connected between the pulse input node PIND and the output node OUTND. The tunable low pass filter 420, for example, may include two stages STG1 and STG2 as illustrated in FIG. 11.

The impedance of the first and second stages STG1 and STG2 may be controlled by a first and second impedance control signals IPDCS_1 and IPDCS_2, respectively. The first stage STG1 may include a first inductor L1 and a first capacitor C1, and the second stage STG2 may include a first inductor L2 and a first capacitor C2. Referring to FIG. 11, the first and second inductors L1 and L2 have fixed inductances, and the first and second capacitors C1 and C2 have variable capacitances. In this case, the capacitances of the first and second capacitors C1 and C2 may be controlled according to the first and second impedance control signals IPDCS_1 and IPDCS_2, respectively. Accordingly, the passband of the tunable low pass filter 420 may be controlled.

Figure 12:
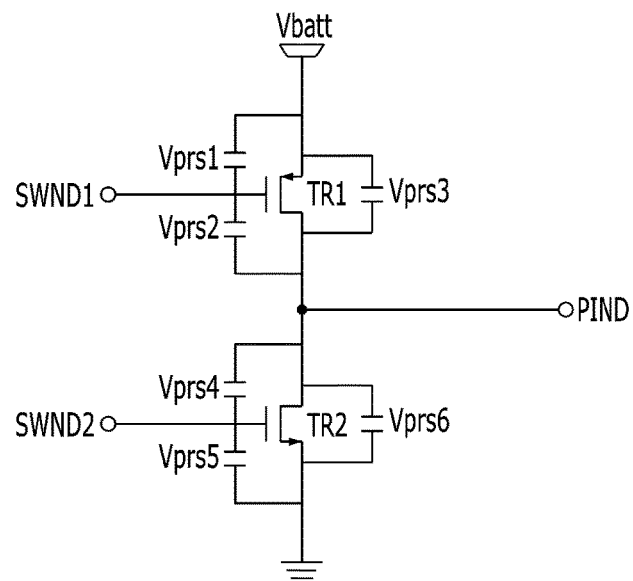
FIG. 12 is a diagram illustrating an exemplary embodiment of a first switching transistor and a second switching transistor of FIG. 11.

FIG. 12 is a diagram illustrating an exemplary embodiment of a first switching transistor and a second switching transistor of FIG. 11.

Referring to FIGS. 11 and 12, the first switching transistor TR1 is connected between a battery voltage and the pulse input node PIND, and is turned on or off in response to the voltage at the first switch node SWND1. The second switching transistor TR2 is connected between the pulse input node PIND and the ground voltage, and is turned on or off in response to the voltage at the second switch node SWND2. The first and second switch nodes SWND1 and SWND2 are connected to the gate driver 412.

The switching transistors may each include parasitic capacitors. The first switching transistor TR1 may include first, second, and third parasitic capacitors Vprs1, Vprs2, and Vprs3 disposed between the gate, source, and drain of the first switching transistor TR1. The second switching transistor TR2 may include first, second, and third parasitic capacitors Vprs4, Vprs5, and Vprs6 disposed between the gate, source, and drain of the second switching transistor TR2.

Due to the parasitic capacitors Vprs1, Vprs2, Vprs3, Vprs4, Vprs5, and Vprs6, switching losses may be caused in the first and second switching transistors TR1 and TR2 when the first and second switching transistors TR1 and TR2 are turned on or off. For example, when the first and second switching transistors TR1 and TR2 are turned on or off, the parasitic capacitors Vprs1, Vprs2, Vprs3, Vprs4, Vprs5, and Vprs6 are charged and discharged. Charging the parasitic capacitors Vprs1, Vprs2, Vprs3, Vprs4, Vprs5, and Vprs6 results in loss of power. Therefore, the loss of power may be reduced by reducing the number of turning on and off the switching transistors. Switching losses may be reduces by reducing the frequency of the pulse signal PLS.

According to the exemplary embodiments, the internal controller 320 (refer to FIG. 10) may control the frequency of the pulse signal PLS in response to the frequency information FI (refer to FIG. 10). For example, the frequency information FI may represent the frequency band of the baseband signal BBS, and the frequency band of the pulse signal PLS may be reduced as the frequency band of the baseband signal BBS is reduced. Referring back to FIG. 7, the frequency band of the baseband signal BBS is less than the first frequency f1, and the frequency of the pulse signal PLS is the third frequency f3. The impedance of each of the plurality of stages STG1 and STG2 (refer to FIG. 11) may be individually controlled so that the tunable low pass filter 420 may have a passband of less than the first frequency f1 (FIG. 7, graph d). In this case, even if the frequency of the pulse signal PLS is changed from the third frequency to the second frequency, the tunable low pass filter 420 may provide −65 dB damping.

According to the exemplary embodiments, as the frequency band of the baseband signal BBS decreases, the tunable low pass filter 420 may be controlled to have reduced passband and the switching circuit 410 may be controlled to reduce the frequency of the pulse signal PLS. Accordingly, the power consumption of the supply modulator 300 may be reduced.

According to the exemplary embodiments, as the frequency band of the baseband signal BBS increases, the tunable low pass filter 420 may be controlled to have increased passband and the switching circuit 410 may be controlled to increase the frequency of the pulse signal PLS. Accordingly, the supply modulator 300 may cover the envelope signals having various frequency bands.

According to the exemplary embodiments, the frequency information FI may include information associated with a guard bandwidth of the FDD scheme, the guard bandwidth may be widened by controlling the switching circuit 410 to reduce the frequency of the pulse signal PLS. The widened guard bandwidth may provide increased margin between the frequency band of the transmission channel and the frequency band of the reception channel. In this case, the reliability of the transmitting device 100 may be improved even when the noise in the modulated voltage MDV is increased. By reducing the frequency of the pulse signal PLS, the reliability of the transmitting device 100 may be improved while reducing the power loss of the supply modulator 140.

Figure 13:
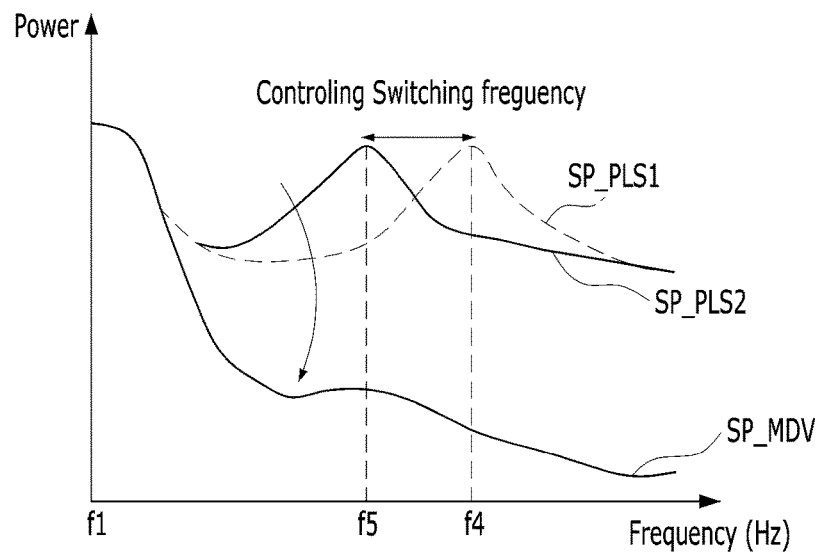
FIG. 13 is a graph illustrating a pulse signal and the power spectrum of a modulated voltage generated by an exemplary embodiment of a supply modulator.

FIG. 13 is a graph illustrating a pulse signal and the power spectrum of a modulated voltage generated by an exemplary embodiment of a supply modulator.

Referring to FIG. 13, the frequency of the pulse signal PLS may be the fourth frequency f4, the first power spectrum SP_PLS1 of the pulse signal PLS may show relative high power level at the first frequency f1 of the envelope signal ENVS, and the fourth frequency f4 of the pulse signal PLS. The frequency of the pulse signal PLS may be reduced from the fourth frequency f4 to a fifth frequency f5 which is less than the fourth frequency f4. The second power spectrum SP_PLS2 of the pulse signal PLS may show relatively high power level at the first frequency f1 of the envelope signal ENVS and the fifth frequency f5 of the pulse signal PLS. Even when the frequency of the pulse signal PLS is the fifth frequency f5, the tunable low pass filter 420 (refer to FIG. 11) according to the exemplary embodiments having certain damping gain (such as −65 dB) at the frequency of the pulse signal PLS, and the power spectrum of the modulated voltage SP_MDV may have a power level less than certain threshold value. Therefore, according to the exemplary embodiments, the supply modulator 140 may have improved reliability and reduced power consumption.

Figure 14:
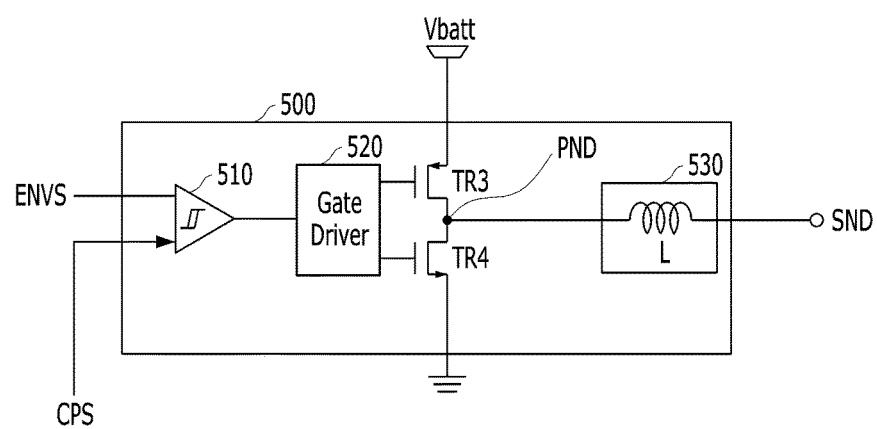
FIG. 14 is a block diagram illustrating an exemplary embodiment of a second switched-mode power supplier of FIG. 10.

FIG. 14 is a block diagram illustrating an exemplary embodiment of a second switched-mode power supplier of FIG. 10. Referring to FIG. 14, the second switched-mode power supplier 500 includes a hysteresis comparator 510, gate driver 520, third and fourth switching transistors TR3 and TR4, and impedance elements 530.

The hysteresis comparator 510 may compare the voltage of the envelope signal ENVS and the voltage of the comparison signal CPS, and may transmit a switching signal in response to the result of the comparison to the gate driver 520. The gate driver 520 may control the third and fourth switching transistors TR3 and TR4 in response to the switching signal received from the hysteresis comparator 510. The third switching transistor TR3 is connected between a battery voltage and a node PND. The fourth switching transistor TR4 is connected between the node PND and the ground voltage. Accordingly, pulse signal is applied to the node PND.

Impedance element 530 is connected between the node PND and the sum node SND. The impedance element may include, for example, an inductor L. The inductor L and the capacitor C2 connected to the output node OUTND of the tunable low pass filter 420 (refer to FIG. 11), and function as another low pass filter. The pulse signal applied to the node PND may be transmitted to the sum node SND through the impedance element 530. Therefore, the second switched-mode power supplier 240 may provide the compensation current to the sum node SND.

Figure 15:
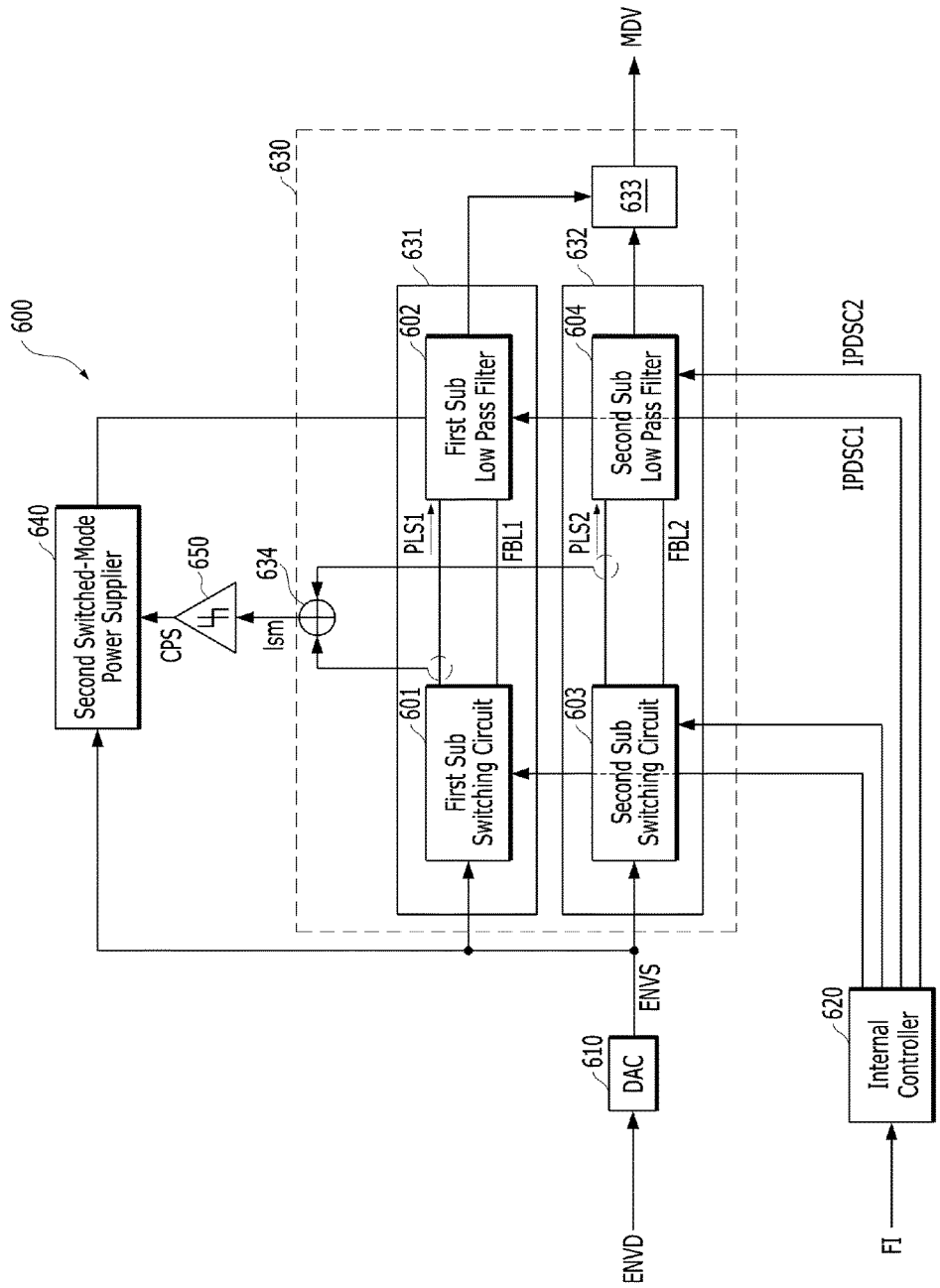
FIG. 15 is a block diagram illustrating an exemplary embodiment of a supply modulator of FIG. 1.

FIG. 15 is a block diagram illustrating an exemplary embodiment of a supply modulator 600 of FIG. 1.

Referring to FIG. 15, the supply modulator 600 may include a Digital-to-Analog (D/A) converter 610, an internal controller 620, the first switched-mode power supplier 630, the second switched-mode power supplier 640, and a comparator 650.

According to the exemplary embodiments, the first switched-mode power supplier 630 may include a plurality of sub low pass filters, and each of the plurality of sub low pass filters may include inductors and variable capacitors. Since variable inductor may not provide sufficient reliability due it it's characteristic, a fixed inductor may be included in the plurality of sub low pass filters. Each of the plurality of sub low pass filters may have different passband, sub switching circuits may be disposed for each of the plurality of sub low pass filters, respectively.

The first switched-mode power supplier 630 includes first and second sub switched-mode power suppliers 631 and 632.

The first sub switched-mode power suppliers 631 includes a first sub switching circuit 601 and a first sub low pass filter 602. The first sub switching circuit 601 generates and transmits a first pulse signal PLS1 in response to the voltage of envelope signal ENVS received from the internal controller 620 and the feedback voltage received through the first feedback line FBL1.

The second sub switched-mode power suppliers 632 includes a second sub switching circuit 603 and a second sub low pass filter 604. The second sub switching circuit 603 generates and transmits a second pulse signal PLS2 in response to the voltage of envelope signal ENVS received from the internal controller 620 and the feedback voltage received through the second feedback line FBL2.

The first and second sub low pass filters 602 and 604 may each include fixed inductor and variable capacitors. The variable capacitors included in the first and second sub low pass filters 602 and 604 may be controlled according to the first and second impedance control signals IPDCS1 and IPDCS2.

The multiplexer 633 may transmit one of the voltages received from the first and second sub low pass filters 602 and 604.

An adder circuit 634 may add the currents of the first and second pulse signals PSL1 and PLS2, and transmits the added current Ism to the comparator 650. The comparator 650 generates the comparison signal CPS in response to the added current Ism. The second switched-mode power supplier may provide compensation current to the first and second sub low pass filters 602 and 604 in response to the comparison signal CPS. For example, the sum node SND (refer to FIG. 14) may be connected to the output nodes of the first and second sub low pass filters OUTND1 and OUTND2 (refer to FIG. 16).

The internal controllers 620 may control the supply modulator 600. The internal controller may select one of the first and second sub switching circuits 601 and 603 in response to the frequency information FI. The pulse signal from the selected sub switching circuit may be transmitted through the corresponding sub low pass filter, as the modulated voltage MDV.

Figure 16:
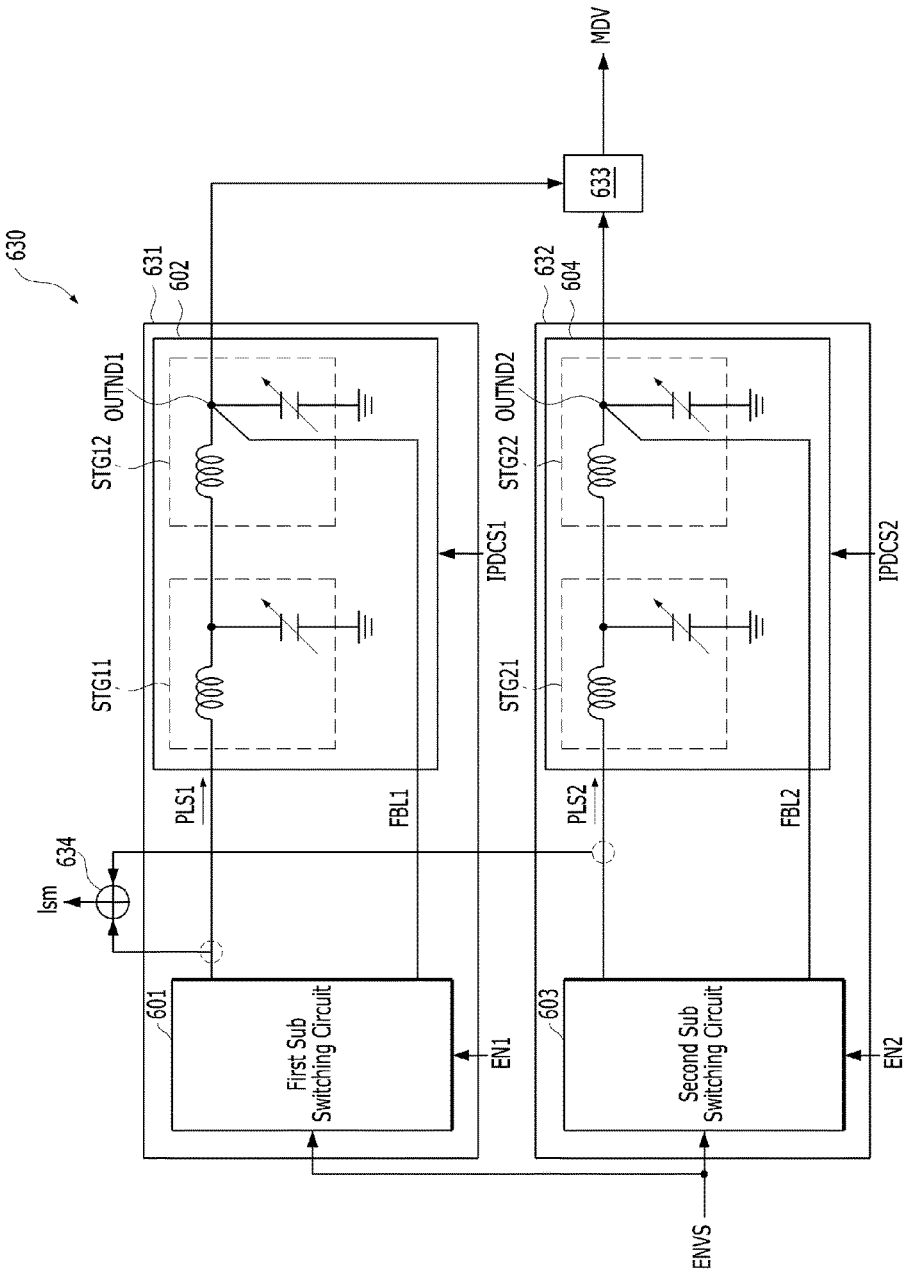
FIG. 16 is a detailed block diagram illustrating an exemplary embodiment of a first switched-mode power supplier of FIG. 15.

FIG. 16 is a detailed block diagram illustrating an exemplary embodiment of a first switched-mode power supplier of FIG. 15.

Referring to FIG. 16, the first and second sub switching circuits 601 and 603 may be enabled by first and second enable signals EN1 and EN2 received from the internal controller 620 (refer to FIG. 15). When the first sub switching circuit 601 is enabled, the first pulse signal PLS1 may be transmitted through the first sub low pass filter 602 as the modulated voltage MDV. When the second sub switching circuit 603 is enabled, the second pulse signal PLS2 may be transmitted through the second sub low pass filter 604 as the modulated voltage MDV.

Each of the stages STG11 and STG12 included in the first sub low pass filter 602 may include fixed inductor and variable capacitor. The variable capacitors of the states STG11 and STG12 may be controlled by the first impedance control signal IPDCS1. Each of the stages STG21 and STG22 included in the second sub low pass filter 604 may include fixed inductor and variable capacitor. The variable capacitors of the states STG21 and STG22 may be controlled by the second impedance control signal IPDCS2. The fixed inductors included in the stages STG11 and STG12 may have different inductance than the stages STG21 and the STG22.

Figure 17:
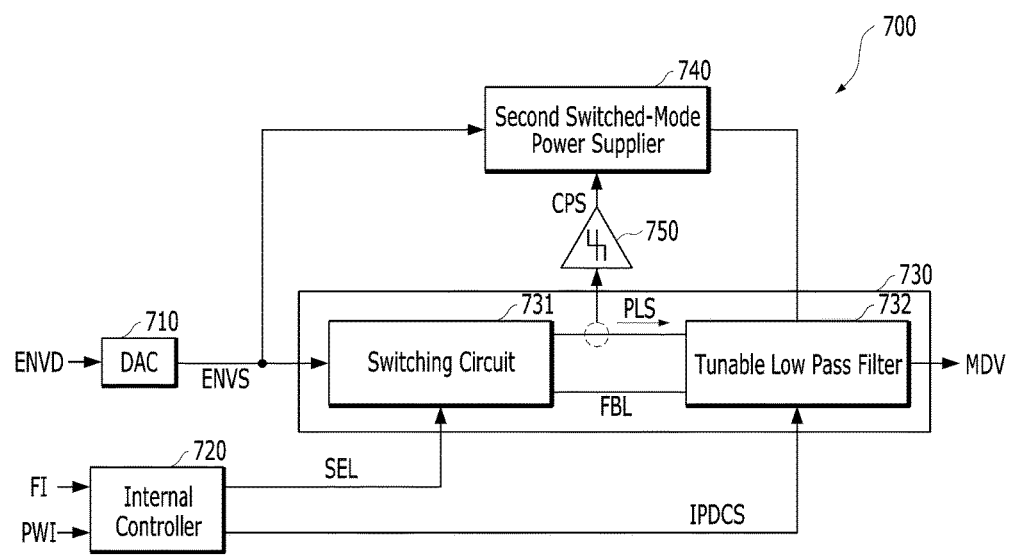
FIG. 17 is a block diagram illustrating an exemplary embodiment of a supply modulator of FIG. 1.

FIG. 17 is a block diagram illustrating an exemplary embodiment of a supply modulator of FIG. 1.

Referring to FIG. 17, the supply modulator 700 may include a Digital-to-Analog (D/A) converter 710, an internal controller 720, the first switched-mode power supplier 730, the second switched-mode power supplier 740, and a comparator 750.

The internal controller 720 may receive a power control information PWI from the modem 110. The amplitude of the pulse signal PLS may be controlled according to the power control information PWI. For example, the supply modulator 140 may further be configured to regulate the battery voltage in response to the power control information PWI (refer to FIG. 20). The regulated battery voltage may replace the battery voltage Vbatt illustrated in FIGS. 11 and 14.

According to the exemplary embodiments, the internal controller 720 may control the switching transistors used to generate the pulse signal PLS, according to the power control information PWI.

Figure 18:
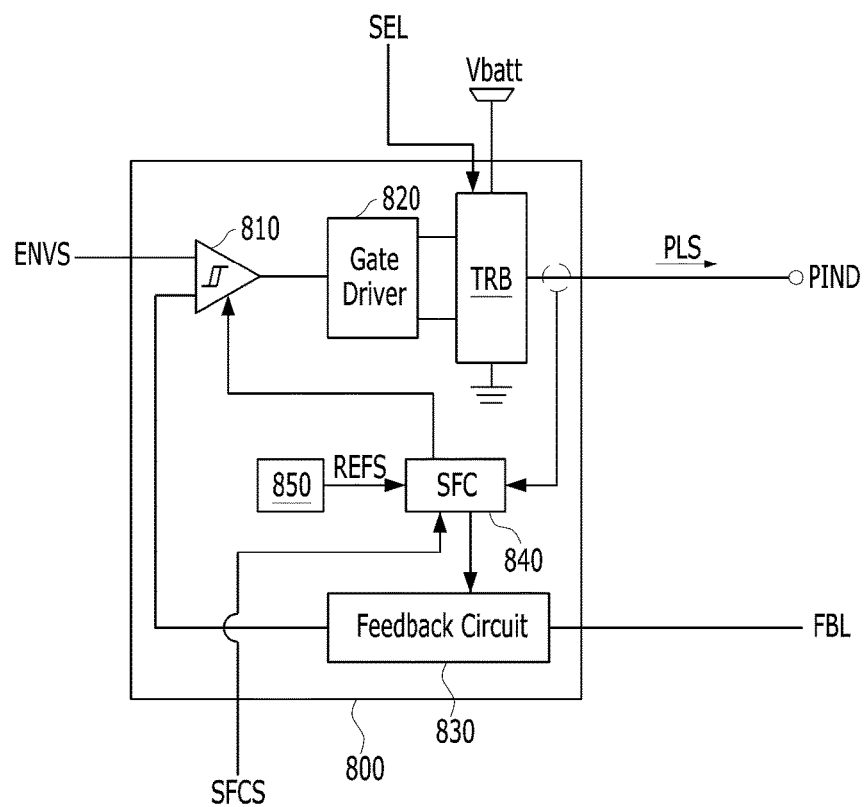
FIG. 18 is a block diagram illustrating an exemplary embodiment of a switching circuit of FIG. 17.

FIG. 18 is a block diagram illustrating an exemplary embodiment of a switching circuit of FIG. 17.

According to FIG. 18, the switching circuit 800 may include a hysteresis comparator 810, a gate driver 820, switching transistor block TRB, a feedback circuit 830, a switching frequency controller 840, and a oscillator 850. The hysteresis comparator 810, the gate driver 820, the feedback circuit 830, the switching frequency controller 840, and the oscillator 850 are substantially identical to the hysteresis comparator 411, the gate driver 412, the feedback circuit 413, the switching frequency controller 414, and the oscillator 415, respectively, and therefore, the descriptions thereof will be omitted.

The switching transistor block TRB may generate the pulse signal PLS by transmitting one of the battery voltage Vbatt and the ground voltage to the pulse input node PIND in response to the control of the gate driver 820.

The switching transistor block TRB may control the switching transistors used to generate the pulse signal PLS in response to the selection signal SEL. The selection signal SEL may be received from the internal controller 720.

Figure 19:
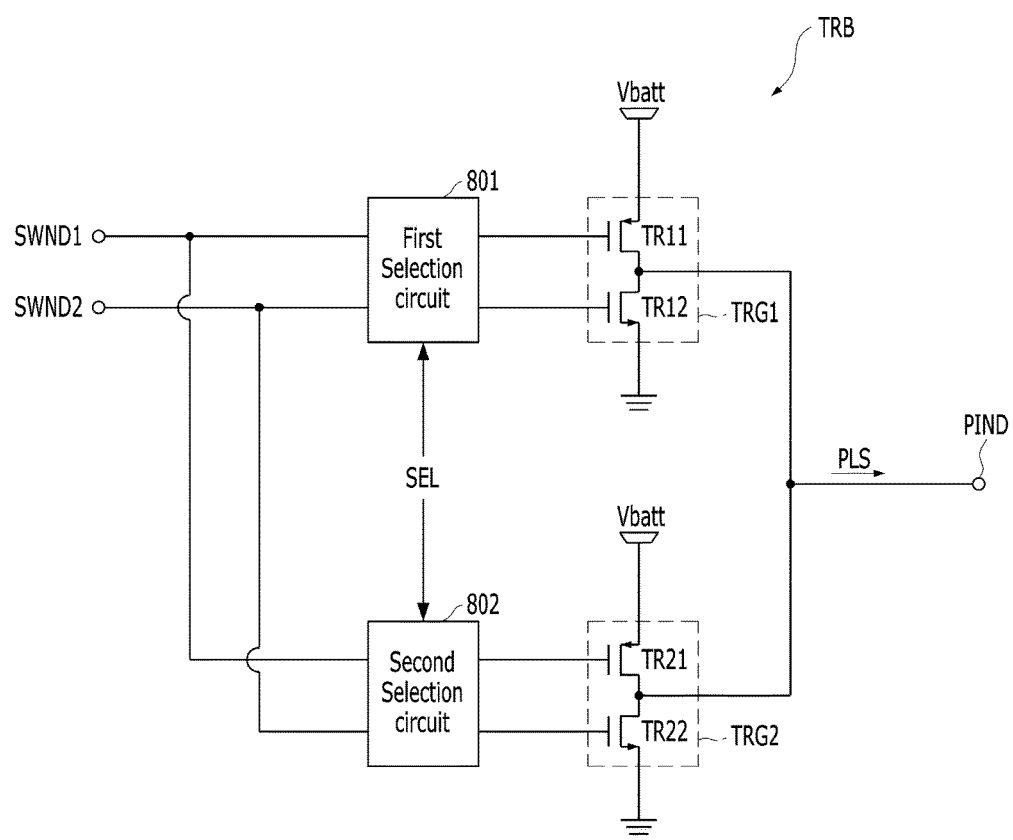
FIG. 19 is a block diagram illustrating an exemplary embodiment of a switching transistor block of FIG. 18.

FIG. 19 is a block diagram illustrating an exemplary embodiment of a switching transistor block TRB of FIG. 18.

Referring to FIGS. 18 and 19, the switching transistor block TRB may include first and second selection circuits 801 and 802 and first and second transistor groups TRG1 and TRG2.

The first selection circuit 801 may be connected between the switching nodes SWND1 and SWND2 and the first transistor group TRG1. The second selection circuit 802 may be connected between the switching nodes SWND1 and SWND2 and the second transistor group TRG2. The switching nodes SWND1 and SWND2 are connected to the gate driver 820.

Each of the transistor groups TRG1 and TRG2 includes two transistors connected in series between the battery voltage Vbatt and the ground voltage. The first transistor group TRG1 includes switching transistors TR11 and TR12. The second transistor group TRG2 includes switching transistors TR21 and TR22. For example, the switching transistors TR11 and TR21 connected between the battery voltage Vbatt and the pulse input node PIND are PMOS transistors, and the switching transistors TR12 and TR22 connected between the pulse input node PIND and the ground voltage are NMOS transistors The switching transistors TR11 and TR12 in the first transistor group TRG1 may be bigger in size than the switching transistors TR21 and TR22 in the second transistor group TRG2.

One of the first and second transistor groups TRG1 and TRG2 may be selected according to the selection signal SEL. The selected transistor group generates the pulse signal PLS in response to the control of the gate driver 820. For example, when the selection signal SEL is disabled, the first selection circuit 801 may connect the first transistor group TRG1 to the switching nodes SWND1 and SWND2. When the selection signal SEL is enabled, the second selection circuit 802 may connect the second transistor group TRG2 to the switching nodes SWND1 and SWND2.

The size of the switching transistor of the pulse signal PLS may be decided according to the selection signal SEL. For example, when the selection signal is disabled, the transistors with bigger size (TR11 and TR12) may be used to generate the pulse signal PLS. When the selection signal is enabled, the transistors with smaller size (TR21 and TR22) may be used to generate the pulse signal PLS.

The modulated voltage MDV may need to be controlled low. For example, when the transmitting device 100 (refer to FIG. 1) close to a cell tower, the power amplifier 130 may have low amplification to reduce the power consumption. Accordingly, the modem 110 (refer to FIG. 1) may control the power control information PWI (refer to FIG. 17) so that the supply modulator 700 may transmit low modulated voltage MDV.

Referring back to FIG. 12, the switching transistors have parasitic capacitors. The parasitic capacitance of the parasitic capacitor may increase as the size of the switching transistor increases. Increased capacitance draws greater electric charge when the switching transistor is turned on. Therefore, switching transistor with bigger size may increase switching losses.

The modulated voltage MDV may need to be controlled high. Accordingly, the modem 110 (refer to FIG. 1) may control the power control information PWI (refer to FIG. 17) so that the supply modulator 700 may transmit high modulated voltage MDV.

High modulated voltage MDV may increase the current of the pulse signal PLS. The switching transistors include resistance element, and resistance of the included resistance element may increase as the size of the switching transistor decreases. Therefore, switching transistor having smaller size may generate increased conduction loss when the current of the pulse signal PLS is increased.

According to the exemplary embodiments, the power control information PWI may be used to select one of the transistor group TRG1 and TRG2 having different switching transistor sizes, and the pulse signal PLS is generated using the selected transistor group. When low modulated voltage MDV is requested (for example, the modulate voltage in the back-off region), the transistor group including small switching transistor size may be selected. Accordingly, the switching losses may be reduced, and the power consumption of the supply modulator 700 may be reduced. When high modulated voltage MDV is requested, the transistor group including big switching transistor size may be selected. Accordingly, the conduction loss may be reduced, and the power consumption of the supply modulator 700 may be reduced.

Figure 20:
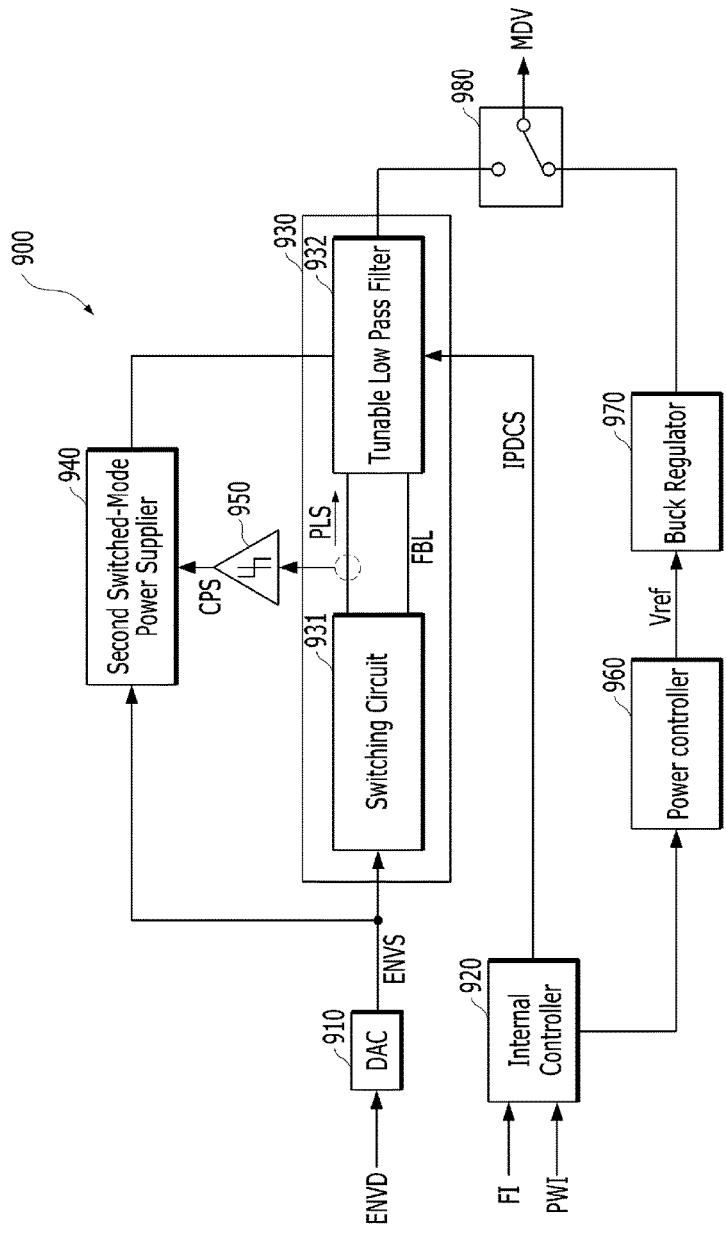
FIG. 20 is a block diagram illustrating an exemplary embodiment of a supply modulator of FIG. 1.

FIG. 20 is a block diagram illustrating an exemplary embodiment of a supply modulator of FIG. 1.

Referring to FIG. 20, the supply modulator 900 may include a Digital-to-Analog (D/A) converter 910, an internal controller 920, a first switched-mode power supplier 930 including a switching circuit 931 and a low pass filter 932, a second switched-mode power supplier 940, a comparator 950, a power controller 960), a buck regulator 970, and a switch 980.

The internal controller 920 may receive the power control information PWI and transmit the power control information PWI to the power controller 960. The power controller 960 may control the reference voltage in response to the power control information PWI to control the output voltage of the buck regulator 970.

The buck regulator 970 may regulate the battery voltage according to a reference voltage Vref. For example, the regulated battery voltage of the buck regulator 970 may replace the battery voltage Vbatt illustrated in FIGS. 11, 14, and 18.

For example, the buck regulator 970 may be a booster. For example, the buck regulator may be DC converter.

The switch 980 may transmit one of the output voltage of the low pass filter 932 and the output voltage of the buck regulator 970 as the modulated voltage MDV.

In response to the power control information PWI, the supply modulator 900 may operate in either one of the Envelope Tracking (ET) method and Average Power Tracking (APT) method. The supply modulator 900 operating in the APT method, the power controller 960 may control the switch 980 to transmit the output voltage of the buck regulator 970 as the modulated voltage MDV. The supply modulator 900 operating in the ET method may control the switch 980 to transmit the output voltage of the low pass filter 932 as the modulated voltage MDV. For example, if the power control information PWI requests for low modulated voltage MDV, the supply modulator 900 may be operated in the APT method. If the power control information PWI requests for high modulated voltage MDV, the supply modulator 900 may be operated in the ET method.

Figure 21:
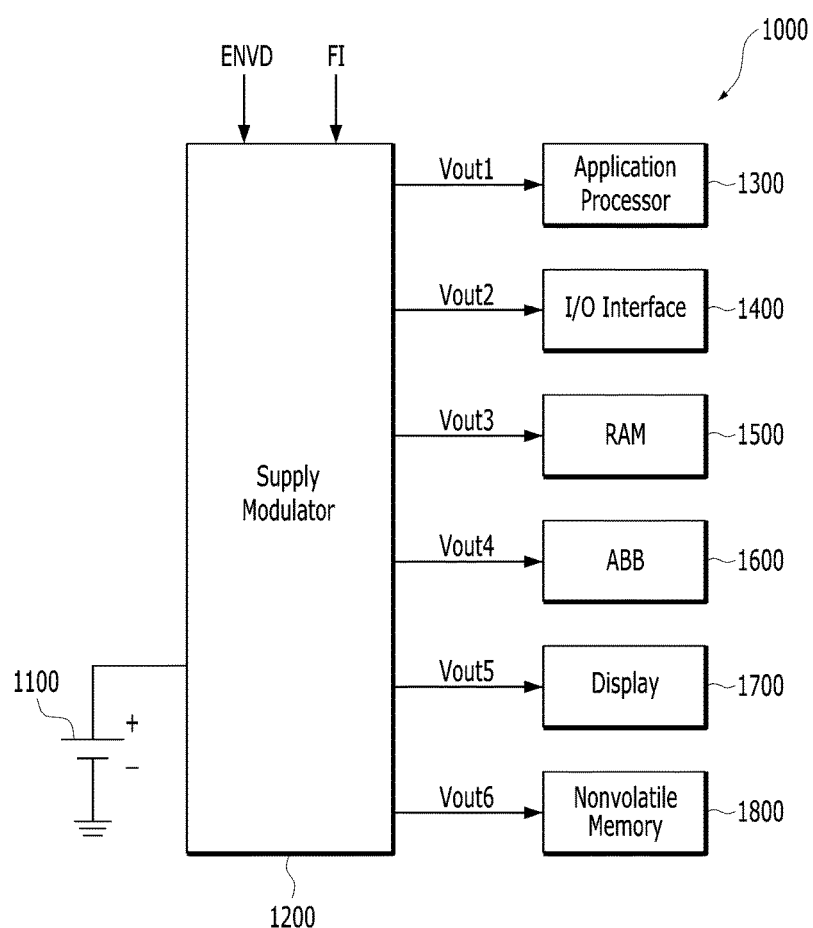
FIG. 21 is a block diagram illustrating an exemplary embodiment of a semi-conductor system according to an exemplary embodiment.

FIG. 21 is a block diagram illustrating an exemplary embodiment of a semi-conductor system 1000 according to an exemplary embodiment.

Referring to FIG. 21, the semi-conductor system 1000 may include a battery 1100, a supply modulator 1200, an application processor AP 1300, an I/O Interface 1400, RAM 1500, an analog baseband chipset ABB 1600, a display 1700, and a nonvolatile memory 1800.

The supply modulator 1200 may modulate the voltage of the battery 1100 to various level of output voltages Vout1~Vout6, and transmit the modulated voltages to various driving parts, including the application processor AP 1300, the I/O Interface 1400, the RAM 1500, the analog baseband chipset ABB 1600, the display 1700, and the nonvolatile memory 1800. The supply modulator 1200 may include one of the supply modulator 140, 300, 600, and 700 illustrated in the FIGS. 2, 10, 15, and 17. The analog baseband chipset ABB 1600 may be any element for wireless communication including the modem 110, radio frequency integrated circuit (RFIC) 120, the power amplifier 130, the supply modulator 140, and the duplexer 150 illustrated in FIG. 1.

The supply modulator 1200 may generate the various output voltages Vout1~Vout6 from the battery voltage in response to the envelope data ENVD and the frequency information FI. According to the exemplary embodiments, the driving parts may transmit the envelope data ENVD and the frequency information FI to the supply modulator 1200. The driving parts may also transmit the power control information PWI (refer to FIG. 17) to the supply modulator 1200.

According to the exemplary embodiments, the semi-conductor system 1000 may be any portable electronic device including battery, such as a mobile telephone.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A supply modulator comprising:
a first switched-mode power supplier configured to transmit a modulated voltage to an output node in response to an envelope signal, the first switched-mode power supplier comprising:
a switching circuit configured to transmit a pulse signal in response to an amplitude of the envelope signal; and
a low pass filter configured to generate the modulated voltage by filtering certain frequency band of the pulse signal, the low pass filter comprising a plurality of stages; and
a second switched-mode power supplier configured to selectively transmit a compensation current to the output node in response to a current transmitted from the first switched-mode power supplier,
wherein each of the plurality of stages of the low pass filter comprises at least one variable impedances.

2. The supply modulator of claim 1, wherein the first switched-mode power supplier further comprises an internal controller, the internal controller configured to control impedances of the at least one variable impedances in response to a frequency information.

3. The supply modulator of claim 2, wherein the frequency information includes information on a frequency band of a baseband signal corresponding to the envelope signal, and
wherein the internal controller is configured to control the impedances of the at least one variable impedances to widen a bandwidth of a passband of the low pass filter in response to an increase of the frequency band of the baseband signal.

4. The supply modulator of claim 2, wherein the frequency information includes information of a guard bandwidth between a frequency band of a transmission channel and a frequency band of a reception channel of a Frequency Division Duplex (FDD) scheme, and
wherein internal controller is configured to control the impedances of the at least one variable impedances to narrow a bandwidth of a passband of the low pass filter in response to a narrowing of the guard bandwidth.

5. The supply modulator of claim 1, wherein the first switched-mode power supplier further comprises an internal controller, the internal controller configured to control a frequency of the pulse signal in response to a frequency information.

6. The supply modulator of claim 5, wherein the frequency information includes information on a frequency band of a baseband signal corresponding to the envelope signal, and
wherein internal controller is configured to decrease the frequency of the pulse signal in response to a decrease of the frequency band of the baseband signal.

7. The supply modulator of claim 5, wherein the frequency information includes information of a guard bandwidth between a frequency band of a transmission channel and a frequency band of a reception channel of a Frequency Division Duplex (FDD) scheme, and
wherein internal controller is configured to decrease the frequency of the pulse signal in response to a widening of the guard bandwidth.

8. The supply modulator of claim 2, wherein the internal controller is further configured to reduce a frequency of the pulse signal in response to a decrease of a passband of the low pass filter.

9. The supply modulator of claim 1, wherein the plurality of stages of the low pass filter comprises a first stage to $n^{th}$ stage sequentially connected between a pulse input node receiving the pulse signal and the output node, wherein:
a first stage comprising a first impedance element connected between a pulse input node and an internal node of the first stage, and a second impedance element connected between the internal node of the first stage and a ground node; and
a $k^{th}$ stage comprising a third impedance element connected between an internal node of a $k-1^{th}$ stage and an internal node of the $k^{th}$ stage, and a fourth impedance element connected between the internal node of the $k^{th}$ stage and the ground node,
wherein an internal node of the $n^{th}$ stage is connected to the output node,
wherein at least one of the first, second, third, and fourth impedance elements comprises a variable impedance, and
wherein n is a natural number greater than 1, and k is a natural number greater than 1 and equal or smaller than n.

10. The supply modulator of claim 9, wherein the first impedance element and the third impedance element each comprise an inductor, and
wherein the second impedance element and the fourth impedance element each comprise at least one of a capacitor and an inductor.

11. The supply modulator of claim 1, wherein the plurality of stages of the low pass filter comprises:
a first stage comprising a first inductor connected between a pulse input node receiving the pulse signal and an internal node, and a first capacitor connected between the internal node and a ground node; and
a second stage comprising a second inductor connected between the internal node and the output node, and a second capacitor connected between the output node and the ground node,
wherein at least one of the first inductor, the first capacitor, the second inductor, and the second capacitor comprises a variable impedance.

12. The supply modulator of claim 11, wherein the first inductor and the second inductor comprises fixed inductances, and
wherein the first capacitor and the second capacitor comprises variable capacitances.

13. The supply modulator of claim 1, the first switched-mode power supplier further comprises an internal controller, the internal controller configured to select switching transistors used to generate the pulse signal, in response to a power control signal.

14. The supply modulator of claim 13, wherein the amplitude of the pulse signal is controlled in response to the power control signal.

15. The supply modulator of claim 13, wherein the switching circuit comprises a first transistor group and a second transistor group,
wherein switching transistors of the first transistor group have different size from switching transistors of the second transistor group,
wherein the internal controller is configured to select one of the first transistor group and the second transistor group in response to the power control signal, and
wherein the switching circuit is configured to transmit the pulse signal using the selected transistor group.

16. A supply modulator comprising:
a first switched-mode power supplier configured to transmit a modulated voltage to an output node in response to an envelope signal, the first switched-mode power supplier comprising:
  a first sub switched-mode power supplier; and
  a second sub switched-mode power supplier; and
a second switched-mode power supplier configured to selectively transmit a compensation current to the output node in response to a current transmitted from the first switched-mode power supplier,
wherein each of the first sub switched-mode power supplier and the second sub switched-mode power supplier comprise:
  a switching circuit configured to transmit a pulse signal in response to an amplitude of the envelope signal; and
  a low pass filter configured to generate the modulated voltage by filtering certain frequency band of the pulse signal, the low pass filter comprising a plurality of stages,
wherein each of the plurality of stages of the low pass filter comprises at least one variable impedances.

17. The supply modulator of claim 16, wherein the each of the plurality of stages of the low pass filter comprises inductors having fixed inductances and capacitors having variable capacitances.

18. The supply modulator of claim 17, wherein the first switched-mode power supplier further comprises an internal controller, the internal controller configured to control the variable capacitances of the capacitors in response to a frequency information.

19. The supply modulator of claim 16, wherein the first switched-mode power supplier further comprises an internal controller, the internal controller configured to enable or disable the first sub switched-mode power supplier and the second sub switched-mode power supplier in response to a frequency information.

20. A hybrid supply modulator comprising:
a first switched-mode power supplier and a second switched-mode power supplier configured to receive envelope signal and transmit generated modulated voltages to an output node,
wherein the first switched-mode power supplier comprises:
  a pulse input node configured to receive a pulse signal based on an amplitude of the envelope signal; and
  a plurality of stages sequentially connected between the pulse input node and the output node, the plurality of stages configured to generate a modulated voltage by filtering certain frequency band of the pulse signal,
wherein each of the plurality of stages comprises at least one variable impedances.

\* \* \* \* \*